US012765070B2

(12) United States Patent
You et al.

(10) Patent No.: US 12,765,070 B2
(45) Date of Patent: Oct. 13, 2026

(54) INTEGRATED CIRCUIT INCLUDING STANDARD CELLS AND METHOD OF DESIGNING THE SAME

(71) Applicant: Samsung Electronics Co., Ltd., Suwon-si (KR)

(72) Inventors: Hyeongyu You, Suwon-si (KR); Jungho Do, Suwon-si (KR); Geonwoo Nam, Suwon-si (KR); Jisu Yu, Suwon-si (KR); Minjae Jeong, Suwon-si (KR); Jaehee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 438 days.

(21) Appl. No.: 18/469,627

(22) Filed: Sep. 19, 2023

(65) Prior Publication Data

US 2024/0105710 A1 Mar. 28, 2024

(30) Foreign Application Priority Data

Sep. 27, 2022 (KR) ........................ 10-2022-0122877

(51) Int. Cl.
*H10D 89/10* (2025.01)
*H10D 84/83* (2025.01)
(Continued)

(52) U.S. Cl.
CPC ........... *H10D 89/10* (2025.01); *H10D 84/834* (2025.01); *H10D 84/859* (2025.01); *H10W 20/42* (2026.01); *H10W 20/43* (2026.01)

(58) Field of Classification Search
CPC .... H10W 20/43; H10W 20/42; H10D 84/834; H10D 84/859; H10D 89/10
See application file for complete search history.

(56) References Cited

U.S. PATENT DOCUMENTS 9,577,639 B1 * 2/2017 Sahu .................. H03K 19/0948
9,985,014 B2 * 5/2018 Xu ......................... H10D 89/10
(Continued)

FOREIGN PATENT DOCUMENTS

CN 110800113 A 2/2020
KR 10-2019-0103686 A 9/2019
(Continued)

OTHER PUBLICATIONS

Flaherty, Nick "Backside power key to Intel process" Technology News—eeNews Power (Retrieved from: https://www.eenewspower.com/en/backside-power-key-to-intel-process) (Jul. 27, 2021).

*Primary Examiner* — Steven M Page
(74) *Attorney, Agent, or Firm* — Wolf, Greenfield & Sacks, P.C.

(57) ABSTRACT

An integrated circuit includes a first cell in a first row extending in a first direction, a first power line extending in the first direction in a power rail layer, and configured to provide a first supply voltage to the first cell, and a first pattern overlapping a first boundary of the first row, and extending in the first direction in a first wiring layer, wherein the first cell includes at least one pattern extending in the first direction in the first wiring layer, and at least one transistor between the power rail layer and the first wiring layer, and the first pattern is configured to receive an input signal or an output signal of the first cell.

20 Claims, 21 Drawing Sheets

(51) Int. Cl.
*H10D 84/85* (2025.01)
*H10W 20/42* (2026.01)
*H10W 20/43* (2026.01)

(56) References Cited

U.S. PATENT DOCUMENTS

| | | | | |
|---|---|---|---|---|
| 10,438,937 | B1 * | 10/2019 | Schultz | H10D 62/83 |
| 10,586,765 | B2 | 3/2020 | Smith et al. | |
| 10,770,479 | B2 | 9/2020 | Smith et al. | |
| 10,872,859 | B2 | 12/2020 | Kim et al. | |
| 10,879,176 | B2 | 12/2020 | Lin et al. | |
| 11,004,789 | B2 | 5/2021 | Doornbos et al. | |
| 11,063,045 | B2 | 7/2021 | Wu et al. | |
| 11,133,254 | B2 | 9/2021 | Lai et al. | |
| 11,201,148 | B2 * | 12/2021 | Liebmann | H10D 88/00 |
| 11,222,831 | B2 * | 1/2022 | Do | H10D 84/85 |
| 11,227,922 | B2 | 1/2022 | Li et al. | |
| 2017/0154848 | A1 * | 6/2017 | Fan | H01L 21/76895 |
| 2019/0268000 | A1 * | 8/2019 | Song | H03K 19/17724 |
| 2020/0124959 | A1 | 4/2020 | Dmitriev et al. | |
| 2021/0098294 | A1 | 4/2021 | Smith et al. | |
| 2021/0135507 | A1 | 5/2021 | Schwartz et al. | |
| 2021/0384186 | A1 * | 12/2021 | Kim | H10D 89/10 |
| 2021/0399099 | A1 | 12/2021 | Chu et al. | |
| 2021/0408246 | A1 | 12/2021 | Ganguly et al. | |
| 2021/0408247 | A1 | 12/2021 | Yu et al. | |
| 2021/0408249 | A1 | 12/2021 | Yu et al. | |
| 2022/0157723 | A1 | 5/2022 | Park et al. | |
| 2022/0165724 | A1 * | 5/2022 | Ishimatsu | H10D 89/10 |
| 2022/0199608 | A1 | 6/2022 | Peng et al. | |

FOREIGN PATENT DOCUMENTS

| | | | |
|---|---|---|---|
| KR | 10-2019-0132089 | A | 11/2019 |
| KR | 10-2021-0134112 | A | 11/2021 |
| KR | 20220065651 | A | 5/2022 |
| KR | 20220069327 | A | 5/2022 |
| KR | 20220075121 | A | 6/2022 |
| KR | 20220087390 | A | 6/2022 |
| KR | 20220088792 | A | 6/2022 |
| KR | 20220092309 | A | 7/2022 |
| KR | 20220096269 | A | 7/2022 |
| KR | 20220097089 | A | 7/2022 |
| KR | 20220100802 | A | 7/2022 |
| KR | 20220106476 | A | 7/2022 |
| KR | 20220114461 | A | 8/2022 |
| KR | 20220115797 | A | 8/2022 |

* cited by examiner

INTEGRATED CIRCUIT INCLUDING STANDARD CELLS AND METHOD OF DESIGNING THE SAME

CROSS-REFERENCE TO RELATED APPLICATION

This application is based on and claims priority under 35 U.S.C. § 119 to Korean Patent Application No. 10-2022-0122877, filed on Sep. 27, 2022, in the Korean Intellectual Property Office, the disclosure of which is incorporated by reference herein in its entirety.

FIELD

The inventive concept relates to an integrated circuit, and more particularly, to an integrated circuit including standard cells and a method of designing the same.

BACKGROUND

An integrated circuit for processing a digital signal may include standard cells, and each of the standard cells may have a unique function and structure. Due to the development of semiconductor processes, the size of standard cells may decrease, and accordingly, routing for interconnecting the standard cells may become more difficult.

SUMMARY

The inventive concept provides an integrated circuit for providing improved routability and a method of designing the same.

According to an aspect of the inventive concept, there is provided an integrated circuit including a first cell in a first row extending in a first direction, a first power line extending in the first direction in a power rail layer, and configured to provide a first supply voltage to the first cell, and a first pattern overlapping a first boundary of the first row, and extending in the first direction in a first wiring layer, wherein the first cell includes at least one pattern extending in the first direction in the first wiring layer, and at least one transistor between the power rail layer and the first wiring layer, and the first pattern is configured to receive an input signal or an output signal of the first cell.

According to another aspect of the inventive concept, there is provided an integrated circuit including a first cell in a first row extending in a first direction, a first power line extending in the first direction in a power rail layer, and configured to provide a first supply voltage to the first cell, and a first pattern and a second pattern adjacent to each other with a first boundary between the first row and a second row adjacent to the first row, and each extending in the first direction in a first wiring layer, wherein the first cell includes at least one pattern extending in the first direction in the first wiring layer, and at least one transistor between the power rail layer and the first wiring layer, and the first pattern is configured to receive an input signal or an output signal of the first cell.

According to another aspect of the inventive concept, there is provided an integrated circuit including a plurality of cells in a plurality of rows extending in a first direction, a plurality of power lines extending in the first direction in a power rail layer, and configured to provide a first supply voltage or a second supply voltage to each of the plurality of cells, and a plurality of first patterns overlapping respective boundaries of the plurality of rows or immediately adjacent to the respective boundaries, and extending in the first direction in a first wiring layer, wherein each of the plurality of cells includes at least one second pattern extending in the first direction in the first wiring layer, and at least one transistor between the power rail layer and the first wiring layer, and the plurality of first patterns include a first pattern configured to receive an input signal or an output signal of a first cell arranged in a first row from among the plurality of cells.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
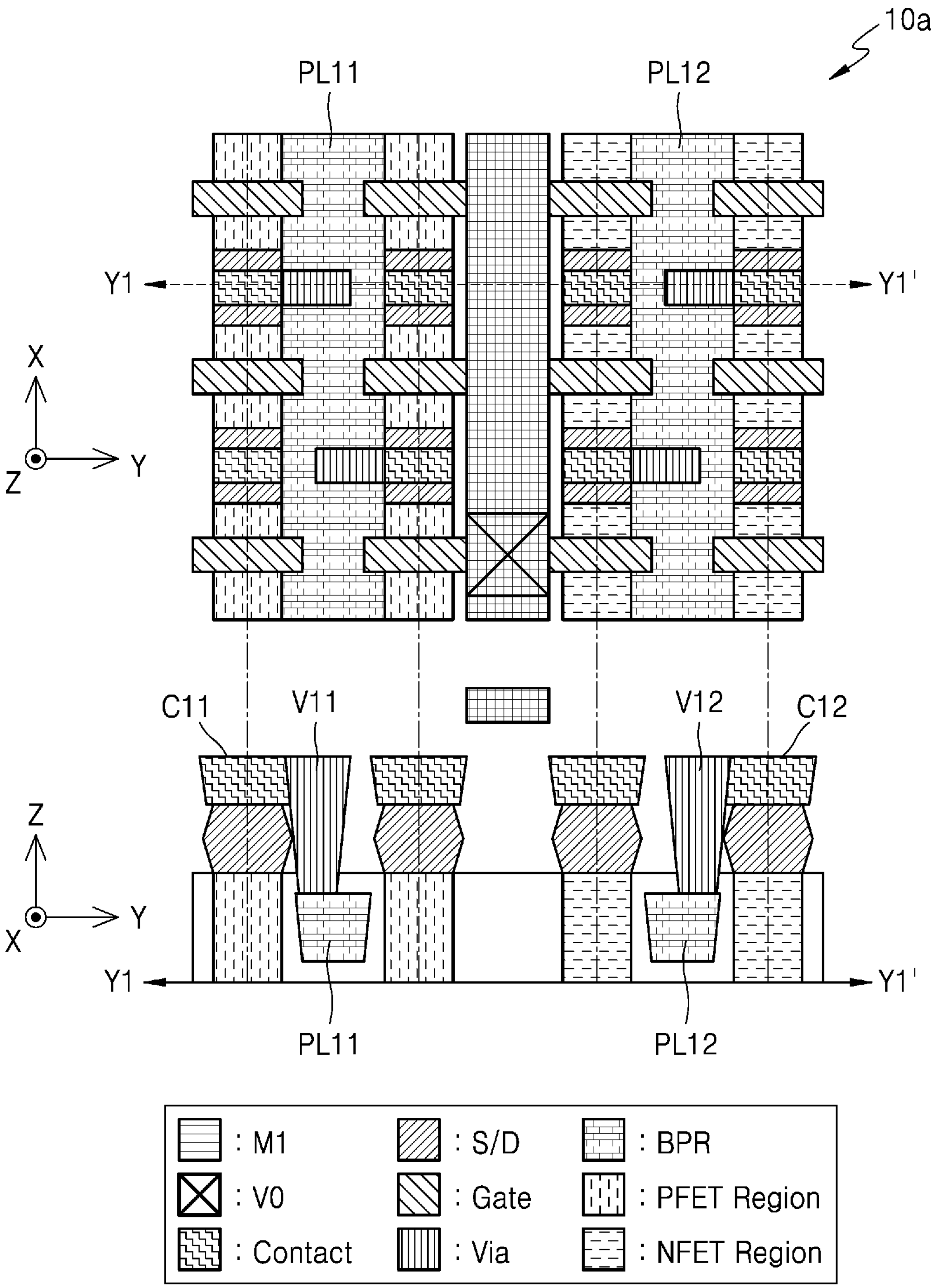
FIGS. 1A, 1, 1C, and 1D are views illustrating layouts of an integrated circuit according to embodiments.

FIGS. 1A to 1D are views illustrating layouts of an integrated circuit according to embodiments. Each of FIGS. 1A to 1D illustrates together a plan view of an integrated circuit and a cross-sectional view of the integrated circuit, taken along line Y1-Y1'. Hereinafter, the same descriptions of FIGS. 1A to 1D as one another will be omitted.

As used herein, an X-axis direction and a Y-axis direction may be referred to as a first direction and a second direction, respectively, and a Z-axis direction may be referred to as a vertical direction or a third direction. The terms "first," "second," etc., may be used herein merely to distinguish one component, layer, direction, etc. from another. A plane including an X axis and a Y axis may be referred to as a horizontal plane, a component arranged relatively in a +Z direction compared to another component may be referred to as being over the other component, and a component arranged relatively in a −Z direction compared to another component may be referred to as being under another component. In addition, an area of a component may refer to a size occupied by the component on a plane parallel to a horizontal plane, and a width of the component may refer to a dimension in a direction orthogonal to a direction in which the length of the component extends. A surface exposed in the +Z direction may be referred to as a top surface, a surface exposed in the −Z direction may be referred to as a bottom surface, and a surface exposed in a ±X direction or a ±Y direction may be referred to as a side surface. In the drawings, only some layers may be illustrated for convenience of illustration, and a via connecting an upper pattern and a lower pattern may be illustrated for understanding even though being located under the upper pattern. In addition, a pattern including a conductive material, such as a pattern of a wiring layer, may be referred to as a conductive pattern or may be referred to simply as a pattern.

An integrated circuit may include a power line for providing a positive supply voltage or a negative supply voltage to a device, for example, a transistor. For example, as illustrated in FIG. 1A, a first power line PL11 may provide a positive supply voltage to a p-channel field effect transistor (PFET) formed in a PFET region, and may extend in an X-axis direction. In addition, a second power line PL12 may provide a negative supply voltage to an n-channel field effect transistor (NFET) formed in an NFET region, and may extend in the X-axis direction. As used herein, a layer (e.g., a metallization layer) in which a power line is formed may be referred to as a power line layer. The power line may include any conductive material, and may be referred to as a power rail when used to supply power to a standard cell as described below with reference to the drawings (for example, the power line layer may also be referred to as power rail layer). In one embodiment, the power rail layer and the wiring layers (e.g., a first wiring layer M1 and a second wiring layer M2) that will be described below may be each on a different metallization layer.

Figure 1B:
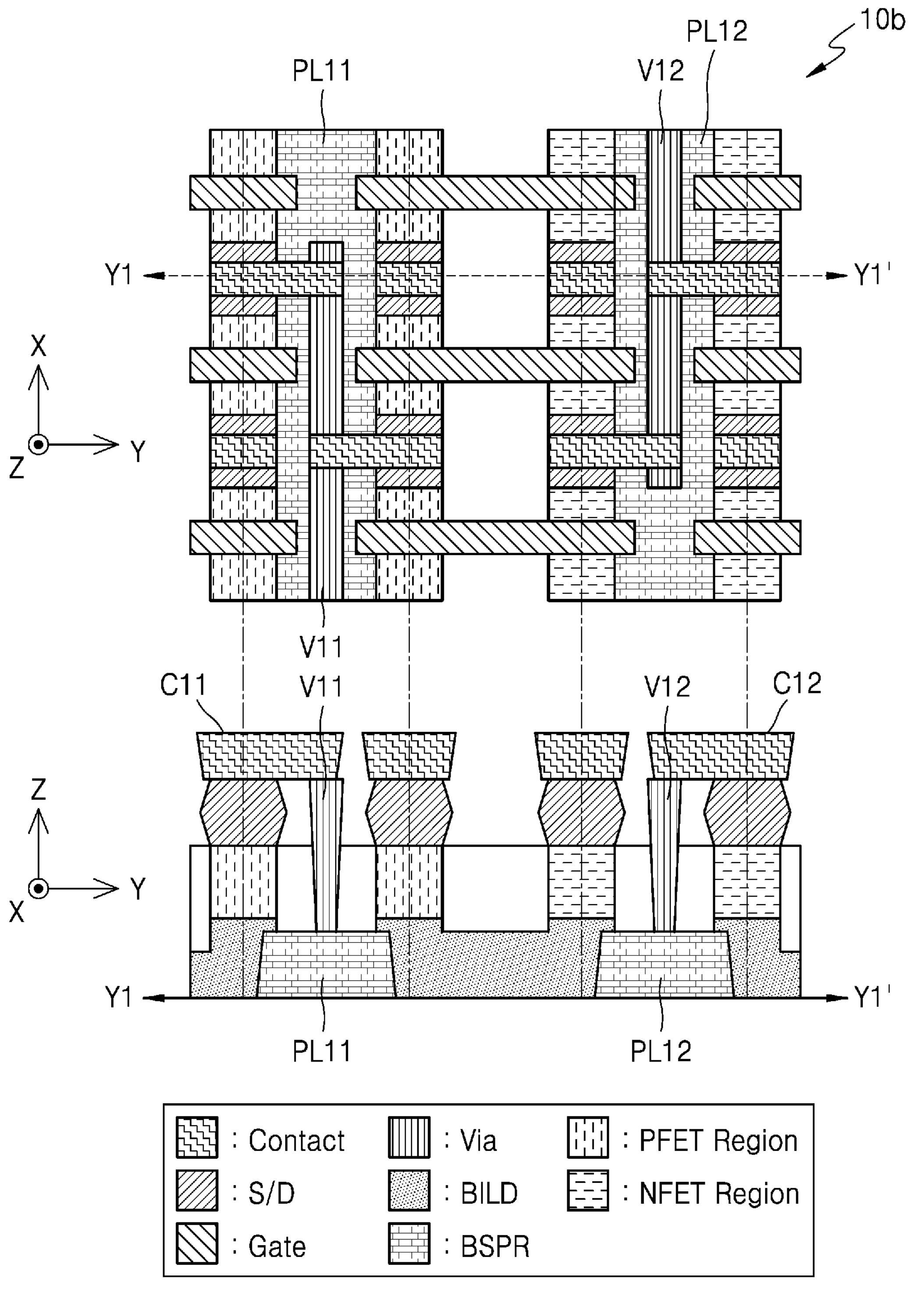
Figure 1C:
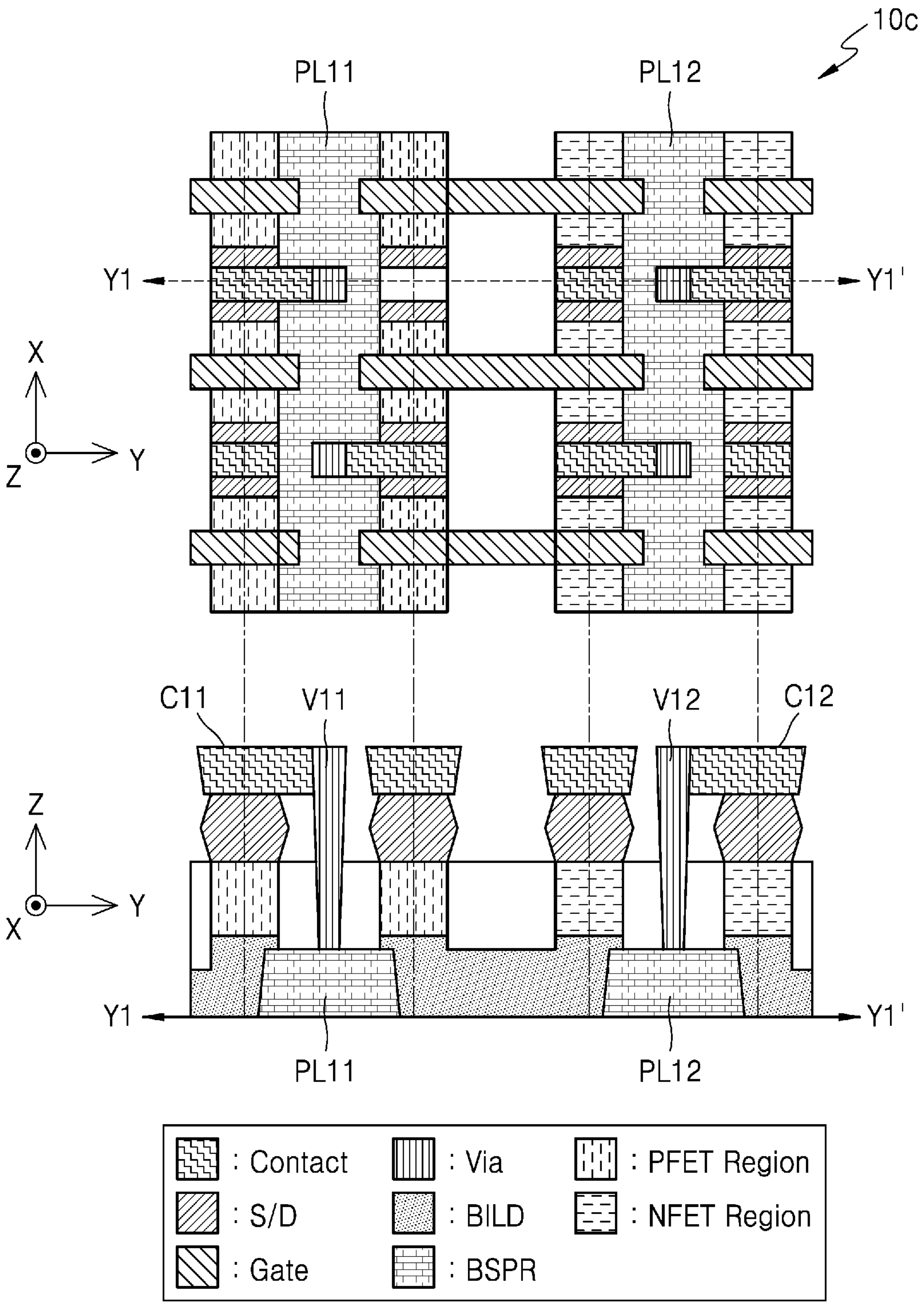
Figure 1D:
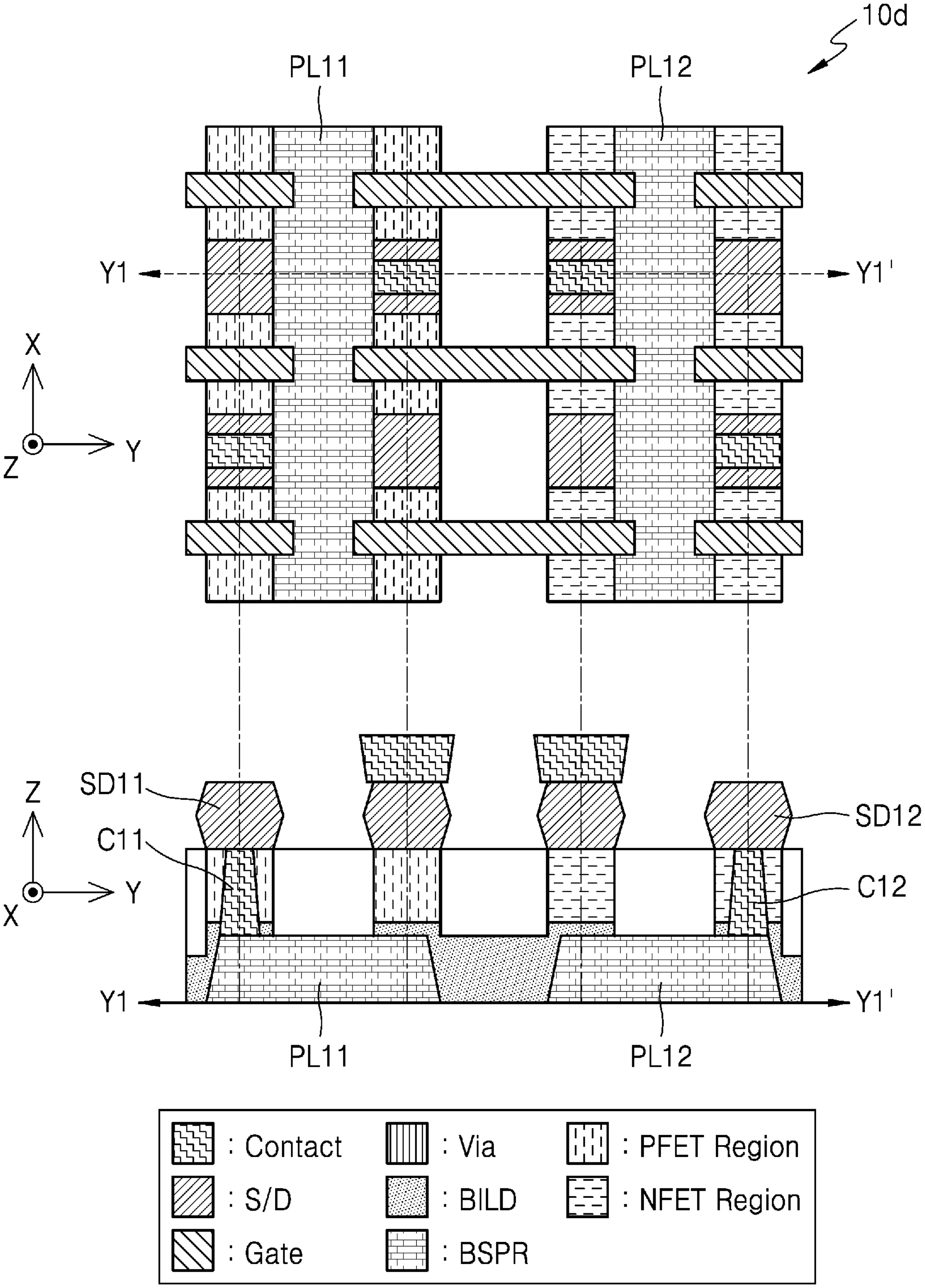

In some embodiments, an integrated circuit may include a power line extending under a transistor, and the transistor may be formed over a power line layer. For example, an integrated circuit may include a buried power rail (BPR) as illustrated in FIG. 1A, or may include a backside power rail (BSPR) as illustrated in FIGS. 1B to 1D. Unlike or in contrast to the illustration in FIGS. 1A to 1D, an example of an integrated circuit including a power line extending over a transistor will be described below with reference to FIG. 3.

Referring to FIG. 1A, an integrated circuit 10*a* may include PFET regions and NFET regions extending in the X-axis direction, and may include gates extending in a Y-axis direction. A source/drain region (also referred to as a source/drain) may be formed on both or opposing sides of the gate, and a contact may be formed on the source/drain. A channel may be formed between source/drain regions, under the gate, and examples of the channel will be described below with reference to FIGS. 2A to 2D.

The first power line PL11 may extend in the X-axis direction between the PFET regions, and the second power line PL12 may extend in the X-axis direction between the NFET regions. In some embodiments, a positive supply voltage may be applied to the first power line PL11, and a negative supply voltage may be applied to the second power line PL12. The integrated circuit 10*a* may include a via connected to a power line and a contact. The term "connected" may be used herein to refer to a physical and/or electrical connection. For example, as illustrated in FIG. 1A, a first via V11 may have a bottom surface connected to the first power line PL11 and a side surface connected to a first contact C11. A second via V12 may have a bottom surface connected to the second power line PL12 and a side surface connected to a second contact C12. As used herein, like the first via V11 and the second via V12, a via extending downward to be connected to a power line may be referred to as a downward via. On the other hand, a via extending upward from a contact to be connected to a pattern of a wiring layer may be referred to as an upward via.

Referring to FIG. 1B, an integrated circuit 10*b* may include PFET regions and NFET regions extending in an X-axis direction, and may include gates extending in a Y-axis direction. A first power line PL11 may extend in the X-axis direction under the PFET regions, and a second power line PL12 may extend in the X-axis direction under the NFET regions. In some embodiments, a positive supply voltage may be applied to the first power line PL11, and a negative supply voltage may be applied to the second power line PL12. The integrated circuit 10*b* may include a via connected to a power line and a contact. For example, as illustrated in FIG. 1B, a first via V11 may have a bottom surface connected to the first power line PL11 and a top surface connected to a first contact C11. A second via V12 may have a bottom surface connected to the second power line PL12 and a top surface connected to a second contact C12. In some embodiments, as illustrated in FIG. 1B, the first via V11 and the second via V12 may extend in the X-axis direction, and may be connected to a plurality of contacts. In one embodiment, a backside interlayer dielectric (BTLD) layer may be formed between the first power line PL11 and the second power line PL12.

Referring to FIG. 1C, an integrated circuit 10*c* may include PFET regions and NFET regions extending in an X-axis direction, and may include gates extending in a Y-axis direction. A first power line PL11 may extend in the X-axis direction under the PFET regions, and a second power line PL12 may extend in the X-axis direction under the NFET regions. In some embodiments, a positive supply voltage may be applied to the first power line PL11, and a negative supply voltage may be applied to the second power line PL12. The integrated circuit 10*c* may include a via connected to a power line and a contact. For example, as illustrated in FIG. 1C, a first via V11 may have a bottom surface connected to the first power line PL11 and a side surface connected to a first contact C11. A second via V12 may have a bottom surface connected to the second power line PL12 and a side surface connected to a second contact C12.

Referring to FIG. 1D, an integrated circuit 10*d* may include PFET regions and NFET regions extending in an X-axis direction, and may include gates extending in a Y-axis direction. A first power line PL11 may extend in the X-axis direction under the PFET regions, and may overlap the PFET regions in a Z-axis direction. A second power line PL12 may extend in the X-axis direction under the NFET regions, and may overlap the NFET regions in the Z-axis direction. The integrated circuit 10*d* may include a contact connected (e.g., directly connected, without a via) to a power line and a source/drain. For example, a first contact C11 may have a bottom surface connected to the first power line PL11 and a top surface connected to a first source/drain SD11. A second contact C12 may have a bottom surface connected to the second power line PL12 and a top surface connected to a second source/drain SD12. As used herein, when components or layers are referred to as "directly on" or "directly connected", no intervening components or layers are present. Likewise, when components are "immediately" adjacent to one another, no intervening components may be present.

As described above with reference to FIGS. 1A to 1D, an integrated circuit may include a power line extending under a transistor, and a power line (e.g., PL31 or PL32 of FIG. 3) extending over a transistor, for example, in a wiring layer, may be omitted. Accordingly, patterns used for wiring in the wiring layer, i.e., routing resources, may increase, and routing congestion may be reduced or eliminated. In addition, an additional area for routing may be removed, and an area of the integrated circuit may be reduced. Also, a signal path may be shortened, and the performance of the integrated circuit may be increased. Hereinafter, as described above with reference to FIG. 1B, a structure including a via having a bottom surface connected to a power line and a top surface connected to a contact will be mainly referred to, but embodiments are not limited thereto.

Figure 2A:
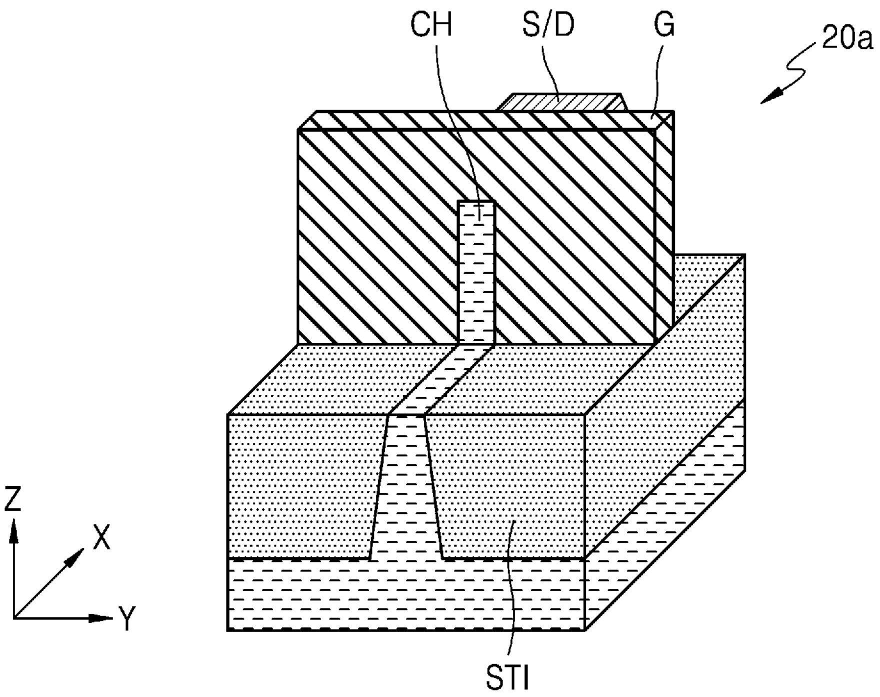
FIGS. 2A, 2B, 2C, and 2D are views illustrating examples of a device according to embodiments.
Figure 2B:
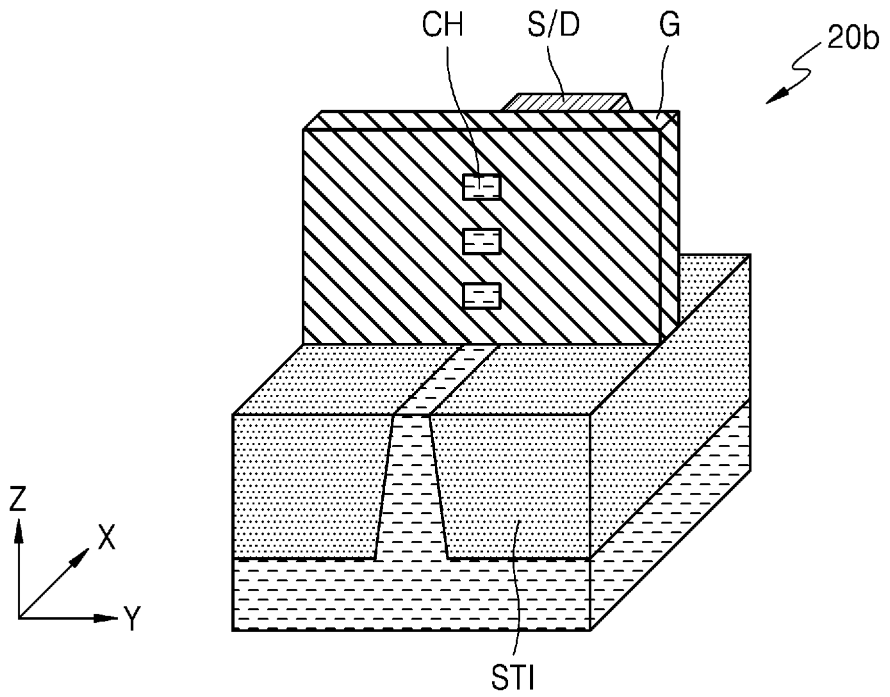
Figure 2C:
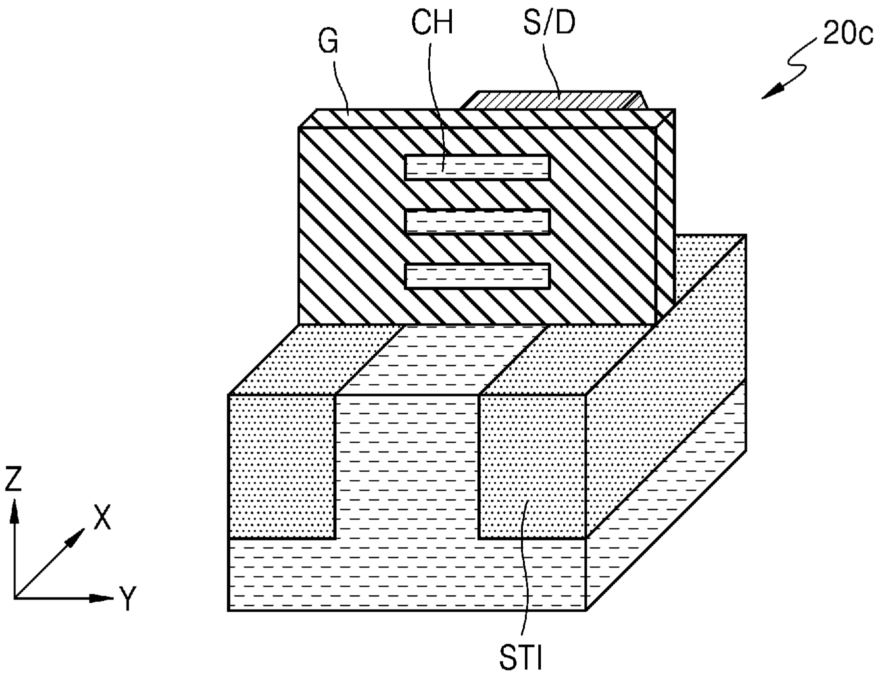
Figure 2D:
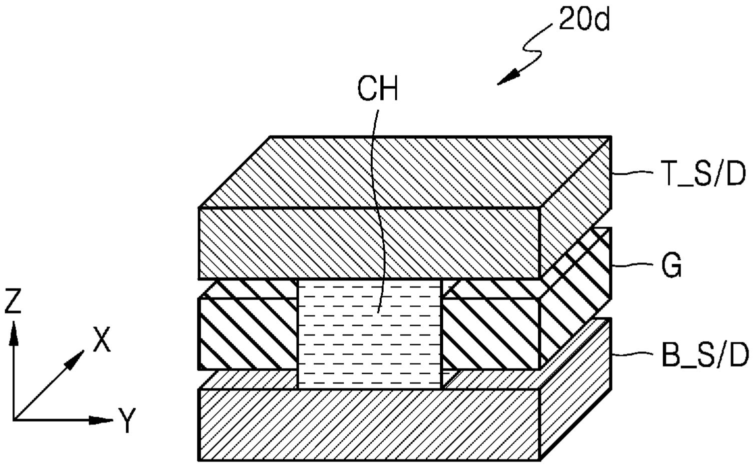

FIGS. 2A to 2D are views illustrating examples of a device according to embodiments. For example, FIG. 2A illustrates a Fin Field-Effect Transistor (FinFET) 20*a*, FIG. 2B illustrates a gate-all-around field effect transistor (GAAFET) 20*b*, FIG. 2C illustrates a multi-bridge channel field effect transistor (MBCFET) 20*c*, and FIG. 2D illustrates a vertical field effect transistor (VFET) 20*d*. For convenience of illustration, FIGS. 2A to 2C illustrate that one of the two source/drain regions is removed, and FIG. 2D illustrates a cross-section of the VFET 20*d* cut with a plane that is parallel to a plane including a Y-axis and a Z-axis and passes through a channel CH of the VFET 20*d*.

Referring to FIG. 2A, the FinFET 20*a* may be formed by a fin-shaped active pattern extending in an X-axis direction between shallow trench isolations (STIs) and a gate G extending in a Y-axis direction. A source/drain S/D may be formed on both or opposing sides of the gate G, and thus, a source and a drain may be spaced apart from each other in the X-axis direction. An insulating layer may be formed between a channel CH and the gate G. In some embodiments, the FinFET 20*a* may be formed by a plurality of active patterns spaced apart from each other in the Y-axis direction and the gate G.

Referring to FIG. 2B, the GAAFET 20*b* may be formed by active patterns spaced apart from each other in a Z-axis direction and extending in an X-axis direction, i.e., nanowires and a gate G extending in a Y-axis direction. A source/drain S/D may be formed on both or opposing sides of the gate G, and thus, a source and a drain may be spaced apart from each other in the X-axis direction. An insulating layer may be formed between a channel CH and the gate G. The number of nanowires included in the GAAFET 20*b* is not limited to that illustrated in FIG. 2B.

Referring to FIG. 2C, the MBCFET 20*c* may be formed by active patterns spaced apart from each other in a Z-axis direction and extending in an X-axis direction, i.e., nanosheets and a gate G extending in a Y-axis direction. A source/drain S/D may be formed on both or opposing sides of the gate G, and thus, a source and a drain may be spaced apart from each other in the X-axis direction. An insulating layer may be formed between a channel CH and the gate G. The number of nanosheets included in the MBCFET 20*c* is not limited to that illustrated in FIG. 2C.

Referring to FIG. 2D, the VFET 20*d* may include a top source/drain T_S/D and a bottom source/drain B_S/D spaced apart from each other in a Z-axis direction with a channel CH located therebetween. The VFET 20*d* may include a gate G surrounding a circumference of the channel CH, between the top source/drain T_S/D and the bottom source/drain B_S/D. An insulating layer may be formed between the channel CH and the gate G.

Hereinafter, an integrated circuit including the FinFET 20*a* or the MBCFET 20*c* will be mainly described, but devices included in the integrated circuit are not limited to the examples of FIGS. 2A to 2D. For example, an integrated circuit may include a ForkFET having a structure in which an N-type transistor and a P-type transistor are closer to each other by separating nanosheets for the P-type transistor and nanosheets for the N-type transistor by a dielectric wall. In addition, the integrated circuit may also include a bipolar junction transistor as well as a FET, such as a complementary FET (CFET), a negative CFET (NCFET), and a carbon nanotube (CNT) FET.

Figure 3:
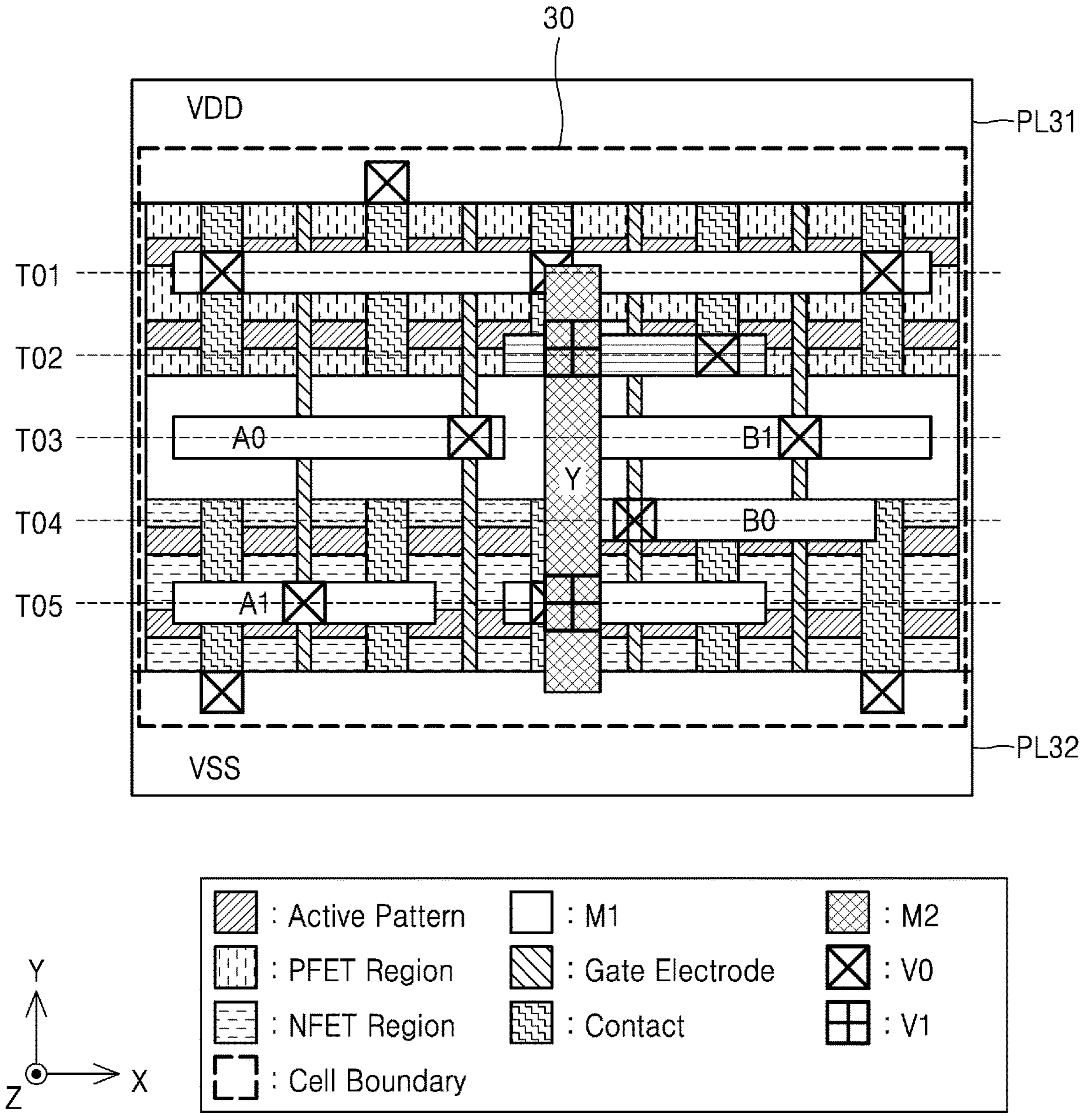
FIG. 3 is a plan view illustrating a layout of an integrated circuit according to an embodiment.

FIG. 3 is a plan view illustrating a layout of an integrated circuit according to an embodiment. For example, the plan view of FIG. 3 illustrates a layout including an AOI22 cell 30, a first power line PL31, and a second power line PL32. The AOI22 cell 30 may include four input pins A0, A1, B0, and B1 and one output pin Y.

An integrated circuit may include a plurality of standard cells. A standard cell may be a unit of a layout included in an integrated circuit, and may be simply referred to as a cell. The cell may include a transistor, and may be designed to perform a predefined function. For example, the AOI22 cell 30 in FIG. 3 may be arranged in a row extending in an X-axis direction, and a height (i.e., a dimension in or along a Y-axis direction) of the AOI22 cell 30 may match a width of the row. Like a first cell 51 of FIG. 5A described below, a standard cell arranged in one row may be referred to as a single height cell, and like a third cell 53 of FIG. 5A described below, a cell continuously arranged in two or more rows may be referred to as a multi-height cell.

A first metallization or first wiring layer M1 may include patterns extending along first to fifth tracks T01 to T05 extending in the X-axis direction and being spaced apart in Y-axis direction at equal intervals. For example, the two input pins A0 and B1 may overlap the third track T03, the input pin B0 may overlap the fourth track T04, and the input pin A1 may overlap the fifth track T05. A pattern of the first wiring layer M1 may have a bottom surface connected to a via of a via layer V0, and may be electrically connected to a contact (e.g., a source/drain contact, a gate contact, or the like) through the via of the via layer V0. In addition, the pattern of the first wiring layer M1 may have a top surface connected to a via of a via layer V1, and may be connected to a pattern of a second metallization or second wiring layer M2 through the via of the via layer V1. The second wiring layer M2 may include the pattern extending in the Y-axis direction. For example, the output pin Y may be electrically connected to the pattern of the first wiring layer M1 through the via of the via layer V1, and may extend in the Y-axis direction.

The first power line PL31 and the second power line PL32 may extend in the X-axis direction, and may overlap a boundary of the AOI22 cell 30. The first power line PL31 may provide a positive supply voltage VDD to the AOI22 cell 30, and the second power line PL32 may provide a negative supply voltage VSS to the AOI22 cell 30. In some embodiments, as illustrated in FIG. 3, each of the first power line PL31 and the second power line PL32 may have a width (i.e., a dimension in or along the Y-axis direction) greater than each of patterns of the first wiring layer M1 for a signal, i.e., each of patterns overlapping the first to fifth tracks T01 to T05.

Due to the development of semiconductor processes, a size of features included in an integrated circuit may decrease, and accordingly, a height of the AOI22 cell 30, i.e., a dimension in the Y-axis direction, may decrease. Accordingly, the number of tracks of the first wiring layer M1 overlapping the AOI22 cell 30 may decrease, and the difficulty of routing using the first wiring layer M1 may increase. Hereinafter, as described below with reference to the drawings, a track for routing a signal may be added in the first wiring layer M1, and routing congestion may be eliminated accordingly.

Figure 4A:
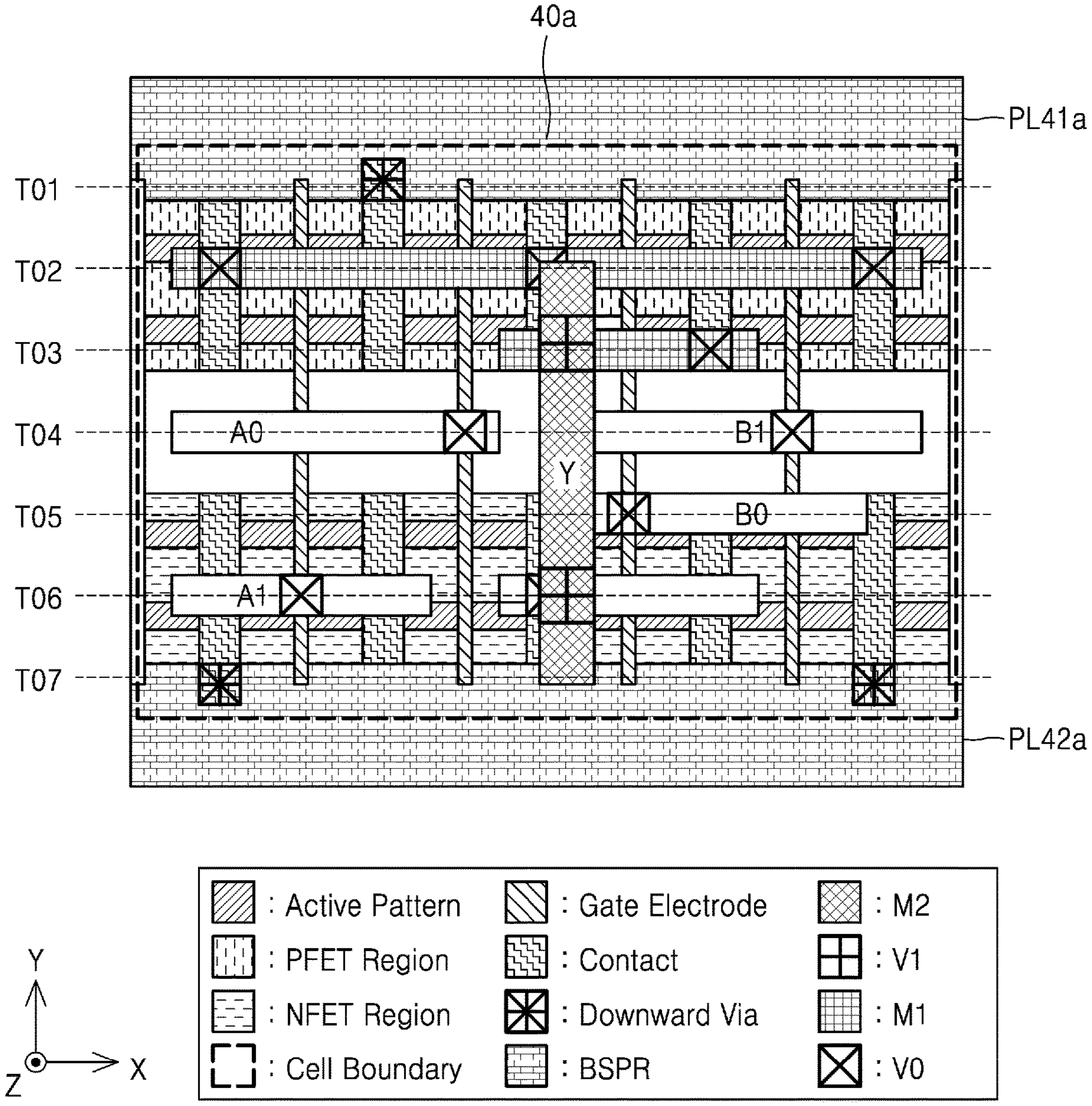
FIGS. 4A, 4B, and 4C are plan views illustrating layouts of an integrated circuit according to embodiments.
Figure 4B:
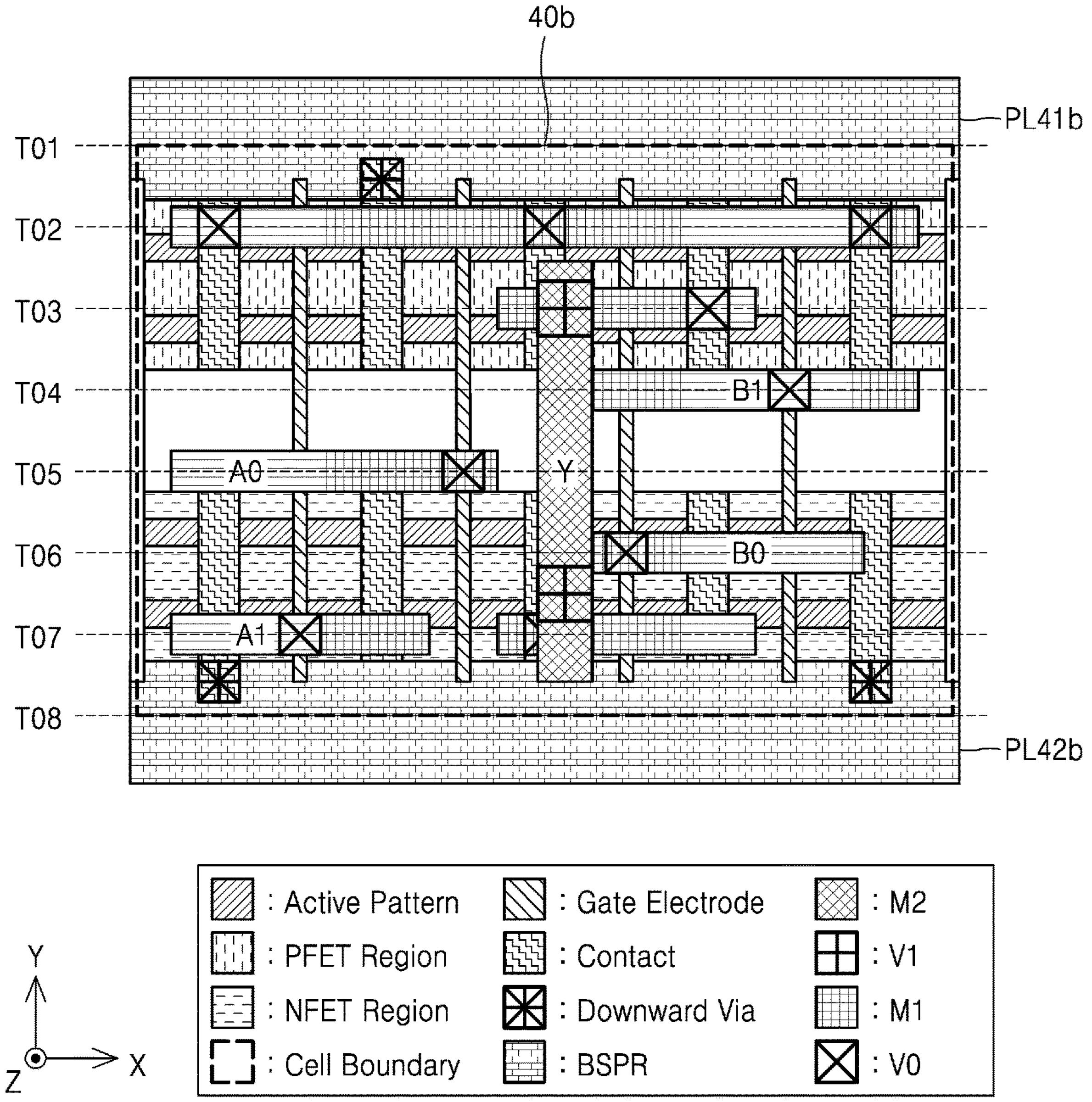
Figure 4C:
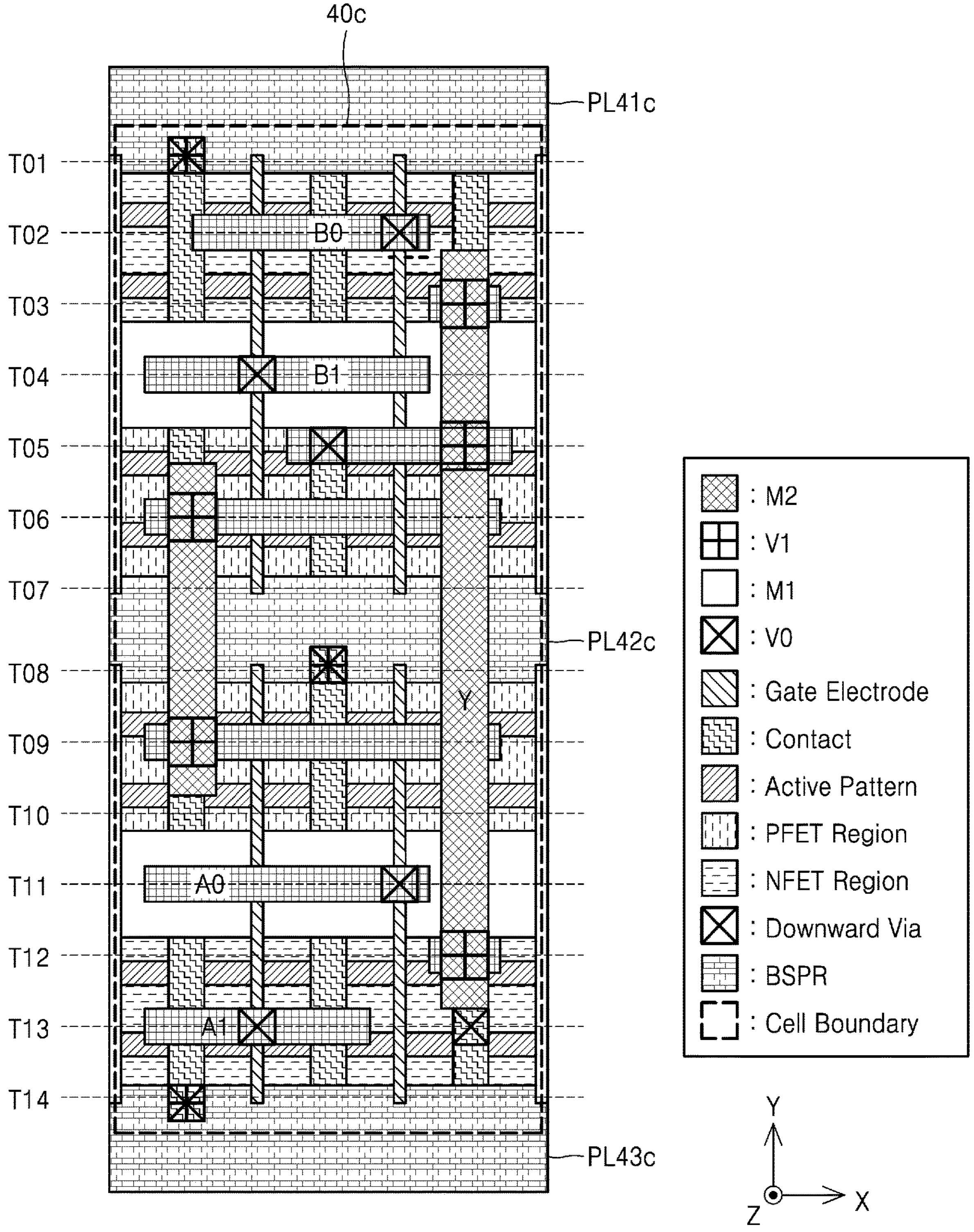

FIGS. 4A to 4C are plan views illustrating layouts of an integrated circuit according to embodiments. For example, the plan view of FIG. 4A illustrates a layout including an AOI22 cell 40*a*, a first power line PL41*a*, and a second power line PL42*a*, the plan view of FIG. 4B illustrates a layout including an AOI22 cell 40*b*, a first power line PL41*b*, and a second power line PL42*b*, and the plan view of FIG. 4C illustrates a layout including an AOI22 cell 40*c* and first to third power lines PL41*c* to PL43*c*. The AOI22 cell 40*a* of FIG. 4A and the AOI22 cell 40*b* of FIG. 4B may be single height cells, and the AOI22 cell 40*c* of FIG. 4C may be a multi-height cell. As described above with reference to FIGS. 1A to 1D, the first power line PL41*a* and the second power line PL42*a* of FIG. 4A, the first power line PL41*b* and the second power line PL42*b* of FIG. 4B, and the first to third power lines PL41*c* to PL43*c* of FIG. 4C may extend in the X-axis direction in power line layers under transistors. Hereinafter, the same descriptions of FIGS. 4A to 4C as the above descriptions with reference to the drawings will be omitted.

Referring to FIG. 4A, patterns of a first wiring layer M1 may extend in the X-axis direction along first to seventh tracks T01 to T07. The AOI22 cell 40*a* may include patterns of the first wiring layer M1 extending in the X-axis direction along the second to sixth tracks T02 to T06. Power lines of the first wiring layer M1 (e.g., PL31 and PL32 in FIG. 3) overlapping a boundary of the AOI22 cell 40*a* and extending in the X-axis direction may be omitted, and thus, in the layout of FIG. 4A, the first track T01 and the seventh track T07 adjacent to boundaries of the AOI22 cell 40*a* parallel to the X-axis direction may be used for routing. Similarly, even in a cell adjacent to the AOI22 cell 40*a* in the Y-axis direction, a track adjacent to a boundary of the cell may be used for routing. Accordingly, the layout of FIG. 4A may provide higher routability than the layout of FIG. 3.

In some embodiments, the first to seventh tracks T01 to T07 may extend in the X-axis direction and be spaced apart in Y-axis direction with a constant or uniform pitch. For example, intervals (e.g., along the Y-axis direction) between adjacent tracks of the first to seventh tracks T01 to T07 may be the same. The boundary of the AOI22 cell 40*a* parallel to the X-axis direction may overlap a center line between adjacent tracks. In some embodiments, patterns of the first wiring layer M1 respectively overlapping the first to seventh tracks T01 to T07 may have the same width (i.e., a dimension in the Y-axis direction).

Referring to FIG. 4B, patterns of a first wiring layer M1 may extend in an X-axis direction along first to eighth tracks T01 to T08. The AOI22 cell 40*b* may include patterns of the first wiring layer M1 extending in the X-axis direction along the second to seventh tracks T02 to T07. Each of the first track T01 and the eighth track T08 may overlap a boundary of the AOI22 cell 40*b*, and may overlap, in a Z-axis direction, the AOI22 cell 40*b* and a cell adjacent to the AOI22 cell 40*b* in a Y-axis direction. Power lines of the first wiring layer M1 (e.g., PL31 and PL32 in FIG. 3) overlapping the boundary of the AOI22 cell 40*b* and extending in the X-axis direction may be omitted, and thus, in the layout of FIG. 4B, the first track T01 and the eighth track T08 overlapping the boundaries of the AOI22 cell 40*b* parallel to the X-axis direction may be used for routing. Accordingly, when compared to the layout of FIG. 3, the layout of FIG. 4B may provide higher routability.

In some embodiments, the first to eighth tracks T01 to T08 may extend in the X-axis direction and be spaced apart in the Y-axis direction at a constant or uniform pitch. For example, intervals (e.g., along the Y-axis direction) between adjacent tracks of the first to eighth tracks T01 to T08 may be the same. The boundary of the AOI22 cell 40*b* parallel to the X-axis direction may overlap a track. In some embodiments, patterns of the first wiring layer M1 respectively overlapping the first to eighth tracks T01 to T08 may have the same width (i.e., a dimension in the Y-axis direction).

Referring to FIG. 4C, patterns of a first wiring layer M1 may extend in an X-axis direction along first to fourteenth tracks T01 to T14. The AOI22 cell 40*c* may include patterns of the first wiring layer M1 extending in the X-axis direction along the second to sixth tracks T02 to T06 and the ninth to thirteenth tracks T09 to T13. Power lines of the first wiring layer M1 (e.g., PL31 and PL32 in FIG. 3) overlapping a boundary of the AOI22 cell 40*c* or a boundary of a row and extending in the X-axis direction may be omitted, and thus, in the layout of FIG. 4C, the first track T01, the seventh track T07, the eighth track T08, and the fourteenth track T14 adjacent to boundaries of the AOI22 cell 40*c* parallel to the X-axis direction and the boundary of the row may be used for routing. Similarly, even in a cell adjacent to the AOI22 cell 40*c* in the Y-axis direction, a track adjacent to a boundary of the cell may be used for routing. Accordingly, the layout of FIG. 4C may provide higher routability than the layout of FIG. 3.

In some embodiments, the first to fourteenth tracks T01 to T14 may extend in the X-axis direction and be spaced apart in Y-axis direction with a constant or uniform pitch. For example, intervals (e.g., along the Y-axis direction) between adjacent tracks of the first to fourteenth tracks T01 to T14 may be the same. In some embodiments, a boundary of the AOI22 cell 40*c* parallel to the X-axis direction may overlap a center line between adjacent tracks. In some embodiments, patterns of the first wiring layer M1 respectively overlapping the first to fourteenth tracks T01 to T14 may have the same width (i.e., a dimension in the Y-axis direction).

Figure 5A:
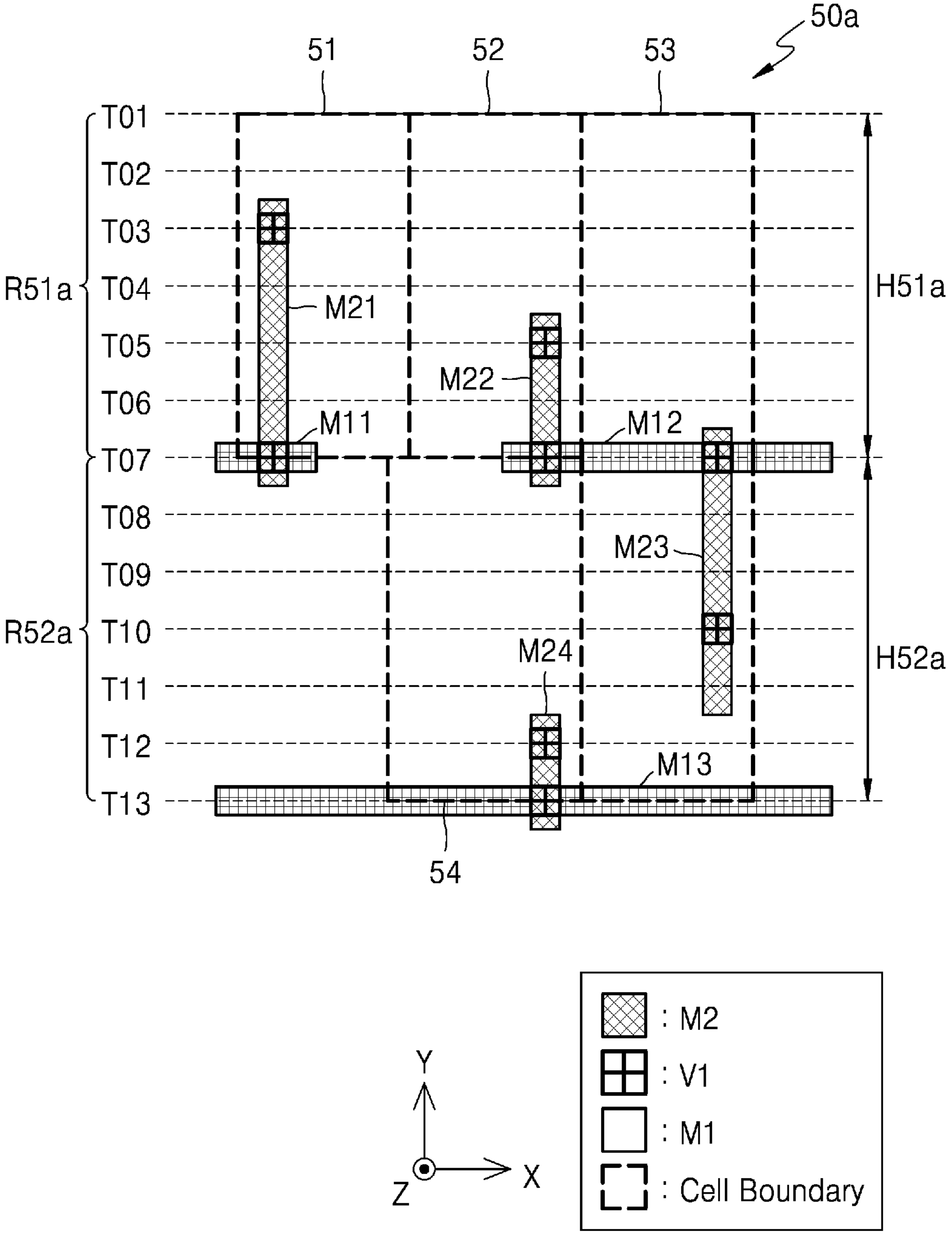
FIGS. 5A and 5B are plan views illustrating layouts of an integrated circuit according to embodiments.
Figure 5B:
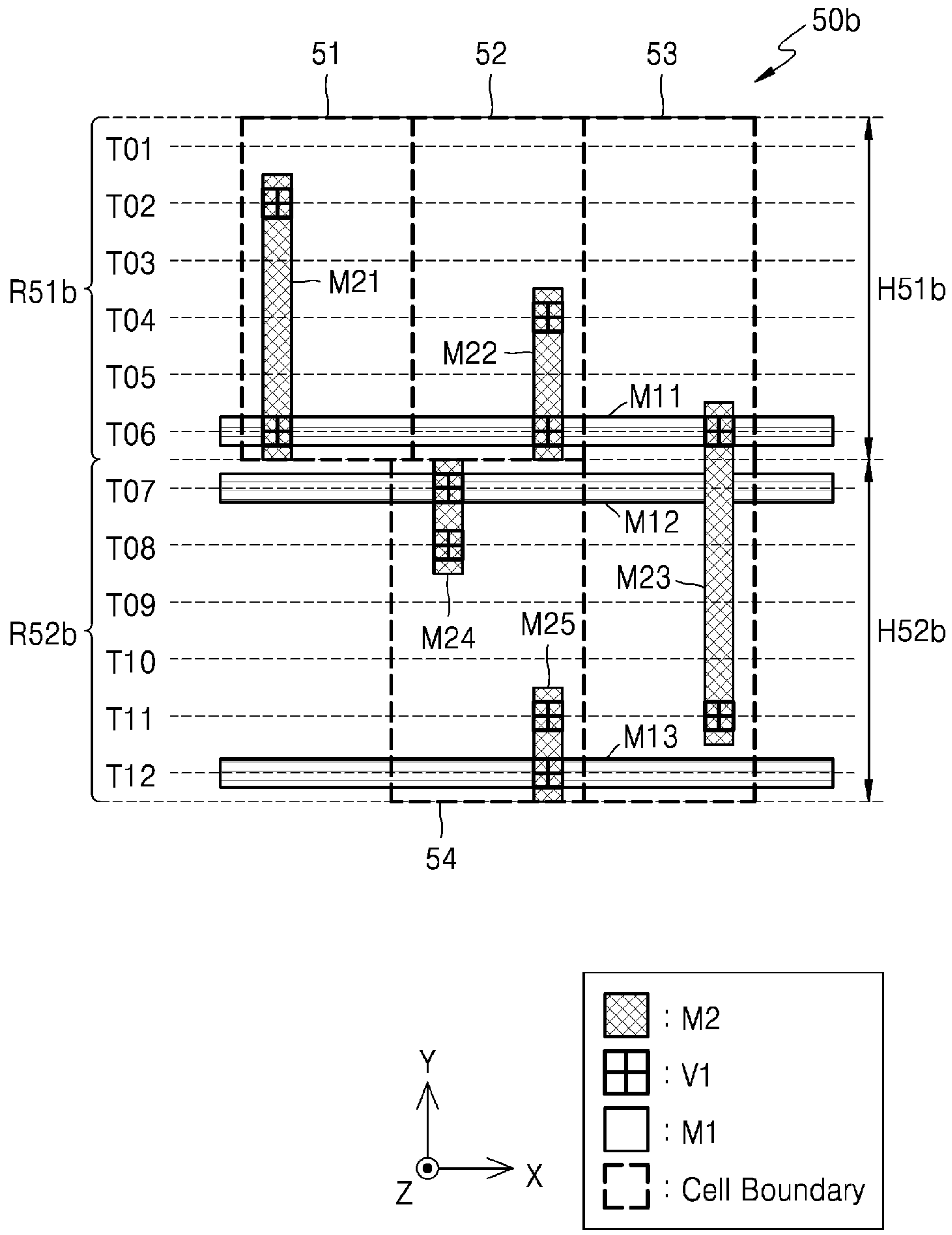

FIGS. 5A and 5B are plan views illustrating layouts of an integrated circuit according to embodiments. For example, the plan views of FIG. 5A and FIG. 5B illustrate some patterns of a first wiring layer M1, some patterns of a second wiring layer M2, and vias of a via layer V1. For convenience of illustration, FIGS. 5A and 5B do not show some patterns of the first wiring layer M1 included in a cell. As described above with reference to the drawings, an integrated circuit 50*a* of FIG. 5A and an integrated circuit 50*b* of FIG. 5B may include power lines extending in an X-axis direction under layers in which a transistor is formed. Hereinafter, the same descriptions of FIGS. 5A and 5B as the above descriptions with reference to the drawings will be omitted.

Referring to FIG. 5A, the integrated circuit 50*a* may include first to fourth cells 51 to 54. The first cell 51 and the second cell 52 may be arranged in a first row R51*a* extending in the X-axis direction, and the fourth cell 54 may be arranged in a second row R52*a*. In addition, the third cell 53 may be continuously arranged in the first row R51*a* and the second row R52*a*. In some embodiments, a height H51*a* of the first row R51*a* and a height H52*a* of the second row R52*a* may be the same as each other.

As described above with reference to FIG. 4B, patterns of a first wiring layer M1 for a signal may extend in the X-axis direction on one or more of the first track T01, the seventh track T07, and the thirteenth track T13 respectively corresponding to boundaries of the first row R51*a* and the second row R52*a*. Accordingly, input pins or output pins of the first to fourth cells 51 to 54 may be connected to a pattern of the first wiring layer M1 extending in the X-axis direction along the first track T01, the seventh track T07, or the thirteenth track T13 via a pattern of a second wiring layer M2. For example, a first pattern M21 may be electrically connected through a via of a via layer V1 to a pattern M11 of the first wiring layer M1 overlapping the seventh track T07. In addition, a second pattern M22 and a third pattern M23 may be electrically connected through vias of the via layer V1, respectively, to a pattern M12 of the first wiring layer M1 overlapping the seventh track T07. Also, a fourth pattern M24 may be electrically connected through a via of the via layer V1 to a pattern M13 of the first wiring layer M1 overlapping the thirteenth track T13. In some embodiments, the third cell 53 may be insulated from the pattern M13 of the first wiring layer M1.

Referring to FIG. 5B, the integrated circuit 50*b* may include first to fourth cells 51 to 54. The first cell 51 and the second cell 52 may be arranged in a first row R51*b* extending in an X-axis direction, and the fourth cell 54 may be arranged in a second row R52*b*. In addition, the third cell 53 may be continuously arranged in the first row R51*b* and the second row R52*b*. In some embodiments, a height H51*b* of the first row R51*b* and a height H52*b* of the second row R52*b* may be the same as each other.

As described above with reference to FIG. 4A, patterns of a first wiring layer M1 for a signal may extend in the X-axis direction along one or more of the first track T01, the sixth track T06, the seventh track T07, and the twelfth track T12 adjacent to boundaries of the first row R51*b* and the second row R52*b*. Accordingly, input pins or output pins of the first to fourth cells 51 to 54 may be connected via a pattern of a second wiring layer M2 to the pattern of the first wiring layer M1 extending in the X-axis direction along the first track T01, the sixth track T06, the seventh track T07, or the twelfth track T12. For example, first to third patterns M21 to M23 may be electrically connected through vias of a via layer V1, respectively, to a pattern M11 of the first wiring layer M1 overlapping the sixth track T06. In addition, a fourth pattern M24 may be electrically connected through a via of the via layer V1 to a pattern M12 of the first wiring layer M1 overlapping the seventh track T07. Also, a fifth pattern M25 may be electrically connected through a via of the via layer V1 to a pattern M13 of the first wiring layer M1 overlapping the twelfth track T12. In some embodiments, the third cell 53 may be insulated from the pattern M13 of the first wiring layer M1.

Figure 6A:
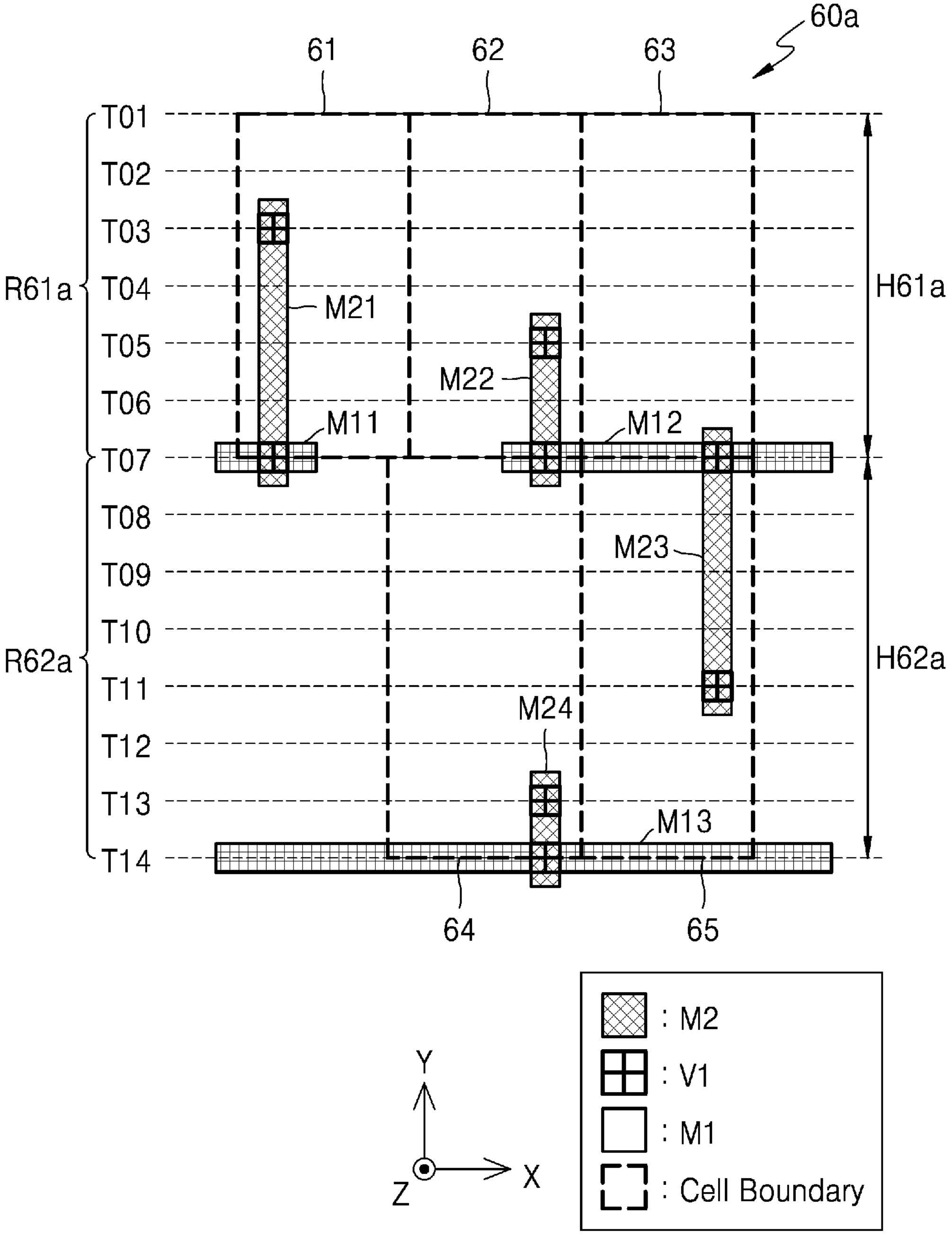
FIGS. 6A and 6B are plan views illustrating layouts of an integrated circuit according to embodiments.
Figure 6B:
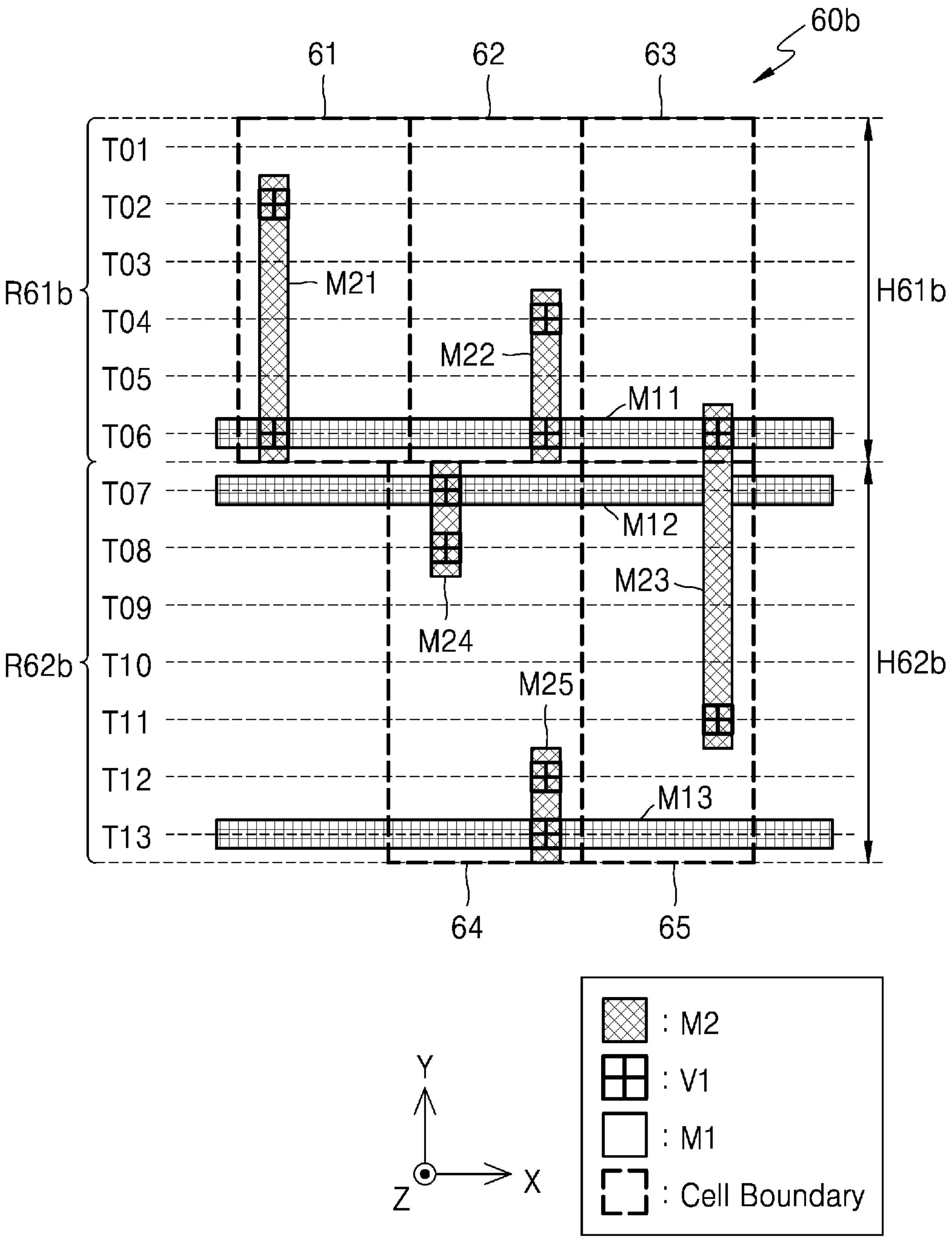

FIGS. 6A and 6B are plan views illustrating layouts of an integrated circuit according to embodiments. For example, the plan views of FIG. 6A and FIG. 6B illustrate tracks of a first wiring layer M1, some patterns of a second wiring layer M2, and vias of a via layer V1. For convenience of illustration, FIGS. 6A and 6B do not show some patterns of the first wiring layer M1 included in a cell. As described above with reference to the drawings, an integrated circuit 60*a* of FIG. 6A and an integrated circuit 60*b* of FIG. 6B may include power lines extending in an X-axis direction under layers in which a transistor is formed. Hereinafter, the same descriptions of FIGS. 6A and 6B as the above descriptions with reference to the drawings will be omitted.

Referring to FIG. 6A, the integrated circuit 60*a* may include first to fifth cells 61 to 65. The first to third cells 61 to 63 may be arranged in a first row R61*a* extending in the X-axis direction, and the fourth cell 64 and the fifth cell 65 may be arranged in a second row R62*a*. In some embodiments, a height H61*a* of the first row R61*a* and a height H62*a* of the second row R62*a* may be different from each other. For example, as illustrated in FIG. 6A, the height H62*a* of the second row R62*a* may be greater than the height H61*a* of the first row R61*a* (H62*a*>H61*a*). Accordingly, the number of eighth to thirteenth tracks T08 to T13 extending in the second row R62*a* may be greater than the number of second to sixth tracks T02 to T06 extending in the first row R61*a*. Cells providing a smaller area may be arranged in the first row R61*a*, and cells providing higher performance may be arranged in the second row R62*a*. Therefore, the integrated circuit 60*a* may be designed to have optimal performance and efficiency.

As described above with reference to FIG. 4B, patterns of the first wiring layer M1 for a signal may extend in the X-axis direction on one or more of the first track T01, the seventh track T07, and the fourteenth track T14 respectively corresponding to boundaries of the first row R61*a* and the second row R62*a*. Accordingly, input pins or output pins of the first to fifth cells 61 to 65 may be connected through a pattern of the second wiring layer M2 to a pattern of the first wiring layer M1 extending in the X-axis direction along the first track T01, the seventh track T07, or the fourteenth track T14. In some embodiments, the pattern of the first wiring layer M1 extending in the X-axis direction along the first track T01, the seventh track T07, or the fourteenth track T14 may be configured to receive input signals or output signals of the first cell 61 to the fifth cell 65. For example, a first pattern M21 may be electrically connected through a via of the via layer V1 to a pattern M11 of the first wiring layer M1 overlapping the seventh track T07. In addition, a second pattern M22 and a third pattern M23 may be electrically connected through vias of the via layer V1, respectively, to a pattern M12 of the first wiring layer M1 overlapping the seventh track T07. Also, a fourth pattern M24 may be electrically connected through a via of the via layer V1 to a pattern M13 of the first wiring layer M1 overlapping the fourteenth track T14. In some embodiments, the fifth cell 65 may be insulated from the pattern M13 of the first wiring layer M1. In some embodiments, FIG. 6A may include the structure of FIG. 4B, and as described above with reference to FIG. 4B, power lines extending in the X-axis direction in the power rail layer may provide supply voltage to respective cells, and each cell may include at least one pattern in the first wiring layer M1 and at least one transistor located between the power rail layer and the first wiring layer M1.

Referring to FIG. 6B, the integrated circuit 60*b* may include first to fifth cells 61 to 65. The first to third cells 61 to 63 may be arranged in a first row R61*b* extending in an X-axis direction, and the fourth cell 64 and the fifth cell 65 may be arranged in a second row R62*b* extending in the X-axis direction. In some embodiments, a height H61*b* of the first row R61*b* and a height H62*b* of the second row R62*b* may be different from each other. For example, as illustrated in FIG. 6B, the height H62*b* of the second row R62*b* may be greater than the height H61*b* of the first row R61*b* (H62*b*>H61*b*). Accordingly, the number of seventh to thirteenth tracks T07 to T13 extending in the second row R62*b* may be greater than the number of first to sixth tracks T01 to T06 extending in the first row R61*b*. Cells providing a smaller area may be arranged in the first row R61*b*, and cells providing higher performance may be arranged in the second row R62*b*. Therefore, the integrated circuit 60*b* may be designed to have optimal performance and efficiency.

As described above with reference to FIG. 4A, patterns of the first wiring layer M1 for a signal may extend in the X-axis direction on one or more of the first track T01, the sixth track T06, the seventh track T07, and the thirteenth track T13 adjacent to boundaries of the first row R61*b* and the second row R62*b*. Accordingly, input pins or output pins of the first to fifth cells 61 to 65 may be connected through a pattern of the second wiring layer M2 to a pattern of the first wiring layer M1 extending in the X-axis direction along the first track T01, the sixth track T06, the seventh track T07, or the thirteenth track T13. For example, first to third patterns M21 to M23 may be electrically connected through vias of the via layer V1, respectively, to a pattern M11 of the first wiring layer M1 overlapping the sixth track T06. In addition, a fourth pattern M24 may be electrically connected through a via of the via layer V1 to a pattern M12 of the first wiring layer M1 overlapping the seventh track T07. Also, a fifth pattern M25 may be electrically connected through a via of the via layer V1 to a pattern M13 of the first wiring layer M1 overlapping the thirteenth track T13. In some embodiments, the fifth cell 65 may be insulated from the pattern M13 of the first wiring layer M1.

Figure 7:
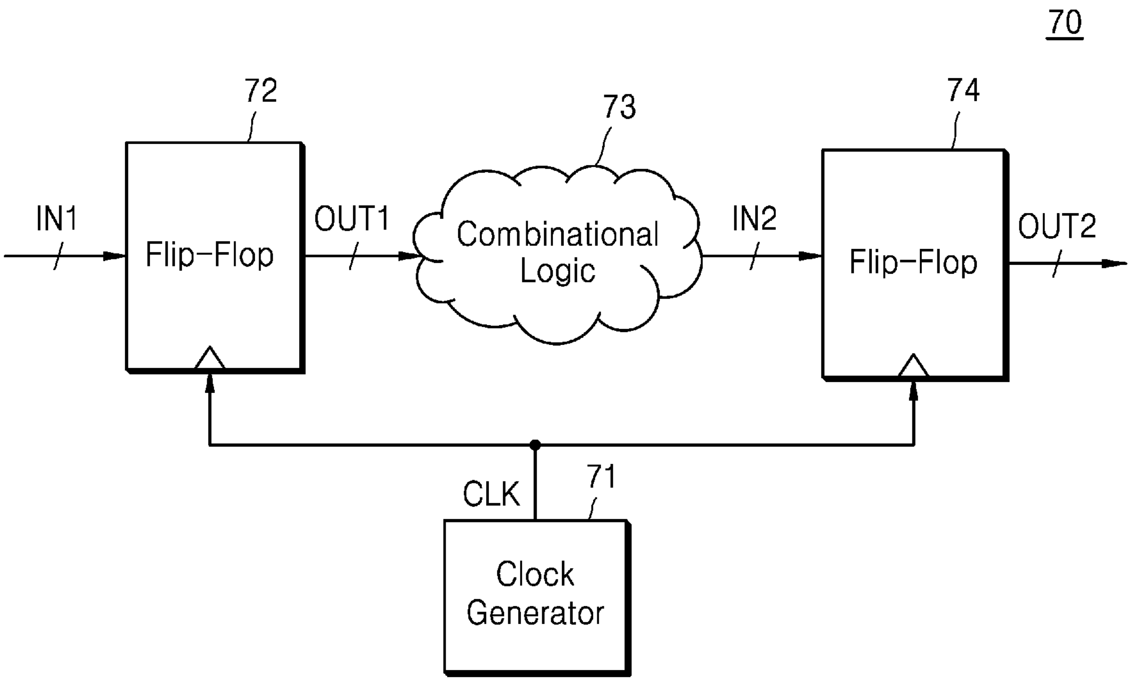
FIG. 7 is a block diagram illustrating an integrated circuit according to an embodiment.

FIG. 7 is a block diagram illustrating an integrated circuit according to an embodiment. As illustrated in FIG. 7, an integrated circuit 70 may include a clock generator 71, a first flip-flop 72, a combinational logic 73, and a second flip-flop 74.

As described above with reference to the drawings, a pattern extending along a track added to the first wiring layer M1 may be easily connected to a plurality of input pins and/or a plurality of output pins. The pattern of the first wiring layer M1 extending along the added track may be used for routing a signal commonly provided to a plurality of cells. Accordingly, a signal path may be simplified or shortened, a delay of the signal may be reduced, and as a result, an operation speed of an integrated circuit may be improved.

Referring to FIG. 7, the integrated circuit 70 may include a circuit that operates in synchronization with a clock signal CLK. For example, as illustrated in FIG. 7, the clock generator 71 may provide, for example, the clock signal CLK having an adjustable frequency to the first flip-flop 72 and the second flip-flop 74. The first flip-flop 72 may provide a first output signal OUT1 corresponding to a first input signal IN1 to the combinational logic 73 in response to an edge of the clock signal CLK, e.g., a rising edge or a falling edge. In addition, the second flip-flop 74 may generate a second output signal OUT2 corresponding to a second input signal IN2 in response to the edge of the clock signal CLK. The combinational logic 73 may generate the second input signal IN2 by processing the first output signal OUT1. Each of the first flip-flop 72 and the second flip-flop 74 may correspond to a cell, and the combinational logic 73 may include at least one cell. In some embodiments, the respective cells depicted in FIG. 5A, FIG. 5B, FIG. 6A, and FIG. 6B may be configured to receive a clock signal as an input signal, and the pattern in the first wiring layer M1 may be configured to receive the clock signal. For example, the pattern of the first line layer M1 extending in the X-axis direction along the first track T01, the seventh track T07, or the fourteenth track T14 in FIG. 6A may be configured to receive a clock signal, and a the pattern of the first line layer M1 extending in the X-axis direction along the first track T01, the sixth track T06, the seventh track T07, or the thirteenth track T13 in FIG. 6B may be configured to receive a clock signal.

The integrated circuit 70 may include a plurality of combinational logics, and may include a plurality of flip-flops respectively corresponding to the combinational logics. The plurality of flip-flops may receive a common clock signal CLK, and accordingly, a path of the clock signal CLK, e.g., a clock tree or a clock network, may affect an operation speed of the integrated circuit 70, i.e., a frequency of the clock signal CLK. In some embodiments, the clock signal CLK may travel through a pattern extending along a track added to the first wiring layer M1. Accordingly, as described above with reference to the drawings, the clock signal CLK may travel along a simple path, and a clock tree or a clock network may be effectively implemented.

Figure 8:
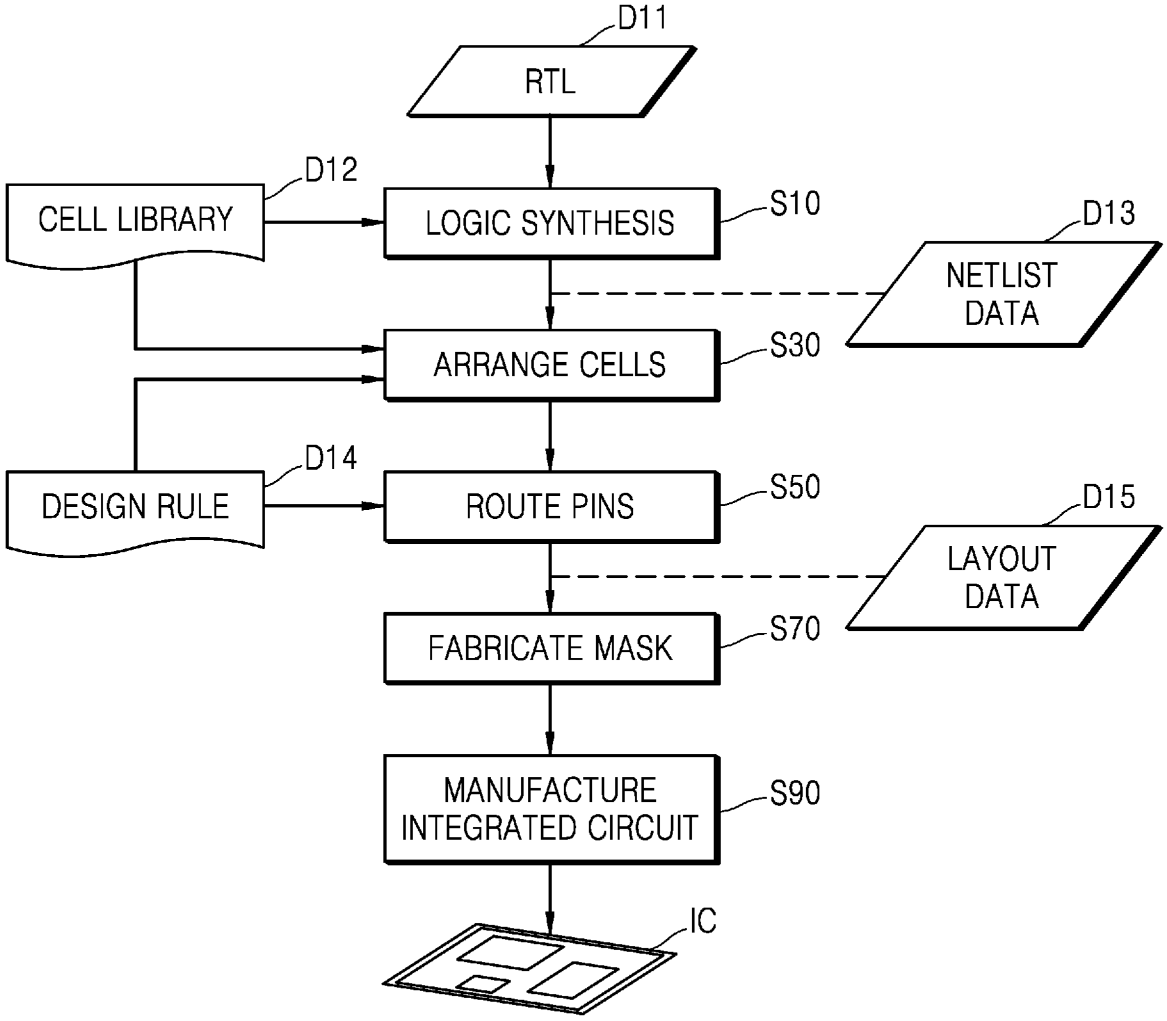
FIG. 8 is a flowchart illustrating a method of manufacturing an integrated circuit, according to an embodiment.

FIG. 8 is a flowchart illustrating a method of manufacturing an integrated circuit IC, according to an embodiment. In detail, the flowchart of FIG. 8 illustrates an example of a method of manufacturing the integrated circuit IC including standard cells. As illustrated in FIG. 8, the method of manufacturing the integrated circuit IC may include a plurality of operations S10, S30, S50, S70, and S90.

A cell library (or a standard cell library) D12 may include information regarding standard cells, for example, information regarding functions, characteristics, layouts, and the like. In some embodiments, the cell library D12 may define a standard cell in which a pattern of the first wiring layer M1 corresponding to a track that overlaps a boundary of a row or is most adjacent to the boundary of the row is omitted, as described above with reference to FIGS. 4A to 4C. In some embodiments, the cell library D12 may define a standard cell including a via connected to a power line extending under a transistor. In some embodiments, the cell library D12 may define standard cells having various heights.

A design rule D14 may include requirements with which a layout of the integrated circuit IC may need to comply. For example, the design rule D14 may include requirements for a space between patterns, a minimum width of the pattern, a routing direction of a wiring layer, and the like in the same layer. In some embodiments, the design rule D14 may define a minimum space within the same track of the wiring layer.

In operation S10, a logic synthesis operation of generating netlist data D13 from register-transfer level (RTL) data D11 may be performed. For example, a semiconductor design tool (e.g., a logic synthesis tool) may perform logic synthesis from the RTL data D11 written in a hardware description language (HDL), such as VHSIC hardware description language (VHDL) and Verilog, by referring to the cell library D12, and may generate the netlist data D13 including a bitstream or a netlist. The netlist data D13 may correspond to an input of place and routing described below.

In operation S30, cells may be arranged or placed. For example, a semiconductor design tool (e.g., a P&R tool) may place standard cells used in the netlist data D13 by referring to the cell library D12. In some embodiments, the semiconductor design tool may place a standard cell in a row extending in the X-axis direction, and the placed standard cell may be electrically connected to a power line extending in the X-axis direction under a transistor.

In operation S50, pins of the cells may be routed. For example, the semiconductor design tool may generate interconnections for electrically connecting output pins and input pins of placed standard cells to each other, and may generate layout data D15 for defining the placed standard cells and the generated interconnections. An interconnection may include a via of a via layer and/or a pattern of a wiring layer. In some embodiments, the interconnections may include patterns of the first wiring layer M1 overlapping a boundary of a row or most adjacent to the boundary of the row. The layout data D15 may have, for example, a format, such as GDSII, and may include geometric information of the cells and the interconnections. The semiconductor design tool may refer to the design rule D14 while routing pins of the cells. The layout data D15 may correspond to an output of place and routing. Operation S50 alone, or operation S30 and operation S50 collectively, may be referred to as a method of designing an integrated circuit. An example of operation S50 will be described below with reference to FIG. 9.

In operation S70, an operation of fabricating a mask may be performed. For example, optical proximity correction (OPC) for correcting distortion, such as refraction due to characteristics of light in photolithography, may be applied to the layout data D15. Patterns on a mask may be defined to form patterns placed in a plurality of layers on the basis of data to which OPC is applied, and at least one mask (or a photomask) for forming patterns in each of the plurality of layers may be fabricated. In some embodiments, the layout of the integrated circuit IC may be limitedly modified in operation S70, and the limited modification of the integrated circuit IC in operation S70 may be post-processing for optimizing a structure of the integrated circuit IC and may be referred to as design polishing.

In operation S90, an operation of manufacturing the integrated circuit IC may be performed. For example, the integrated circuit IC may be manufactured by patterning a plurality of layers by using the at least one mask fabricated in operation S70. A front-end-of-line (FEOL) may include, for example, an operation of planarizing and cleaning a wafer, an operation of forming a trench, an operation of forming a well, an operation of forming a gate electrode, and an operation of forming a source and a drain. Individual devices, for example, a transistor, a capacitor, a resistor, and the like, may be formed on a substrate by the FEOL. In addition, a back-end-of-line (BEOL) may include, for example, an operation of silicidating a gate, and source and drain regions, an operation of adding a dielectric, a planarization operation, an operation of forming a hole, an operation of adding a metal layer, an operation of forming a via, an operation of forming a passivation layer, and the like. Individual devices, for example, a transistor, a capacitor, a resistor, and the like, may be interconnected by the BEOL. In some embodiments, a middle-of-line (MOL) may be performed between the FEOL and the BEOL, and contacts may be formed on individual devices. Subsequently, the integrated circuit IC may be packaged in a semiconductor package, and may be used as a component of various applications.

Figure 9:
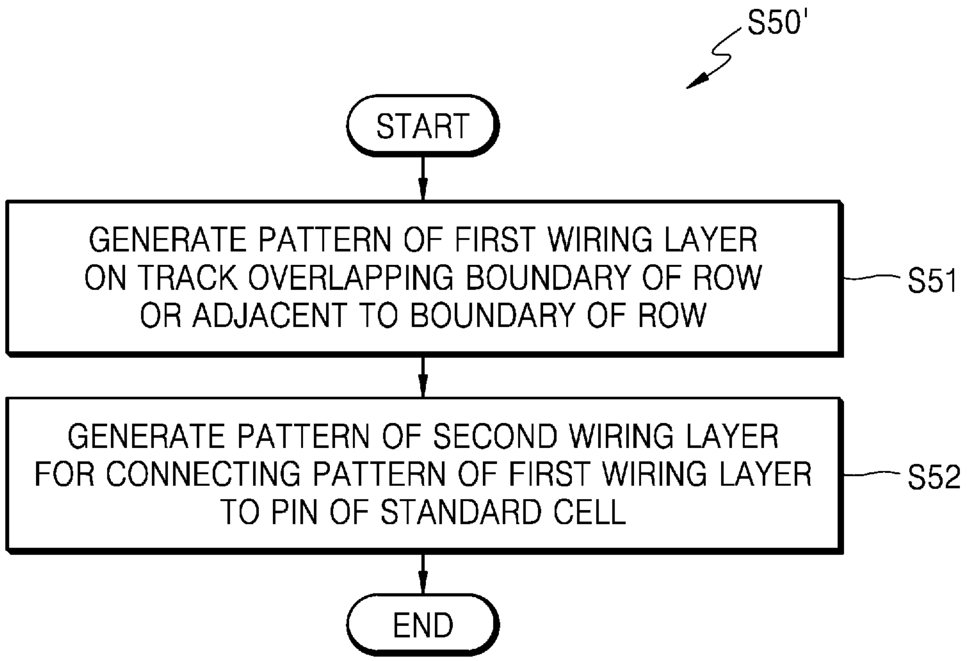
FIG. 9 is a flowchart illustrating a method of designing an integrated circuit, according to an embodiment.

FIG. 9 is a flowchart illustrating a method of designing an integrated circuit, according to an embodiment. For example, the flowchart of FIG. 9 illustrates an example of operation S50 of FIG. 8. As described above with reference to FIG. 8, in operation S50' of FIG. 9, pins of a standard cell may be routed, and interconnections may be generated. As illustrated in FIG. 9, operation S50' may include operations S51 and S52. Hereinafter, FIG. 9 will be described with reference to FIGS. 5A and 5B.

Referring to FIG. 9, in operation S51, a pattern of a first wiring layer M1 may be generated on a track overlapping a boundary of a row or adjacent to the boundary of the row. For example, a semiconductor design tool may generate the patterns M11 and M12 on the seventh track T07 overlapping the boundary of the first row R51*a* of FIG. 5A, and may generate the pattern M13 on the thirteenth track T13 overlapping the boundary of the second row R52*a*. In addition, the semiconductor design tool may respectively generate the patterns M11 and M12 on the sixth track T06 and the seventh track T07 adjacent to the boundary of the first row R51*b* of FIG. 5B, and may generate the pattern M13 on the twelfth track T12 adjacent to the boundary of the second row R52*b*.

In operation S52, a pattern of the second wiring layer M2 for connecting the pattern of the first wiring layer M1 to a pin of a standard cell may be generated. For example, the semiconductor design tool may generate the first pattern M21 electrically connected to the pattern M11 of FIG. 5A, may generate the second pattern M22 and the third pattern M23 electrically connected to the pattern M12, and may generate the fourth pattern M24 electrically connected to the pattern M13. In addition, the semiconductor design tool may generate the first pattern M21, the second pattern M22 and the third pattern M23 electrically connected to the pattern M11 of FIG. 5B, may generate the fourth pattern M24 electrically connected to the pattern M12, and may generate the fifth pattern M25 electrically connected to the pattern M13.

Figure 10:
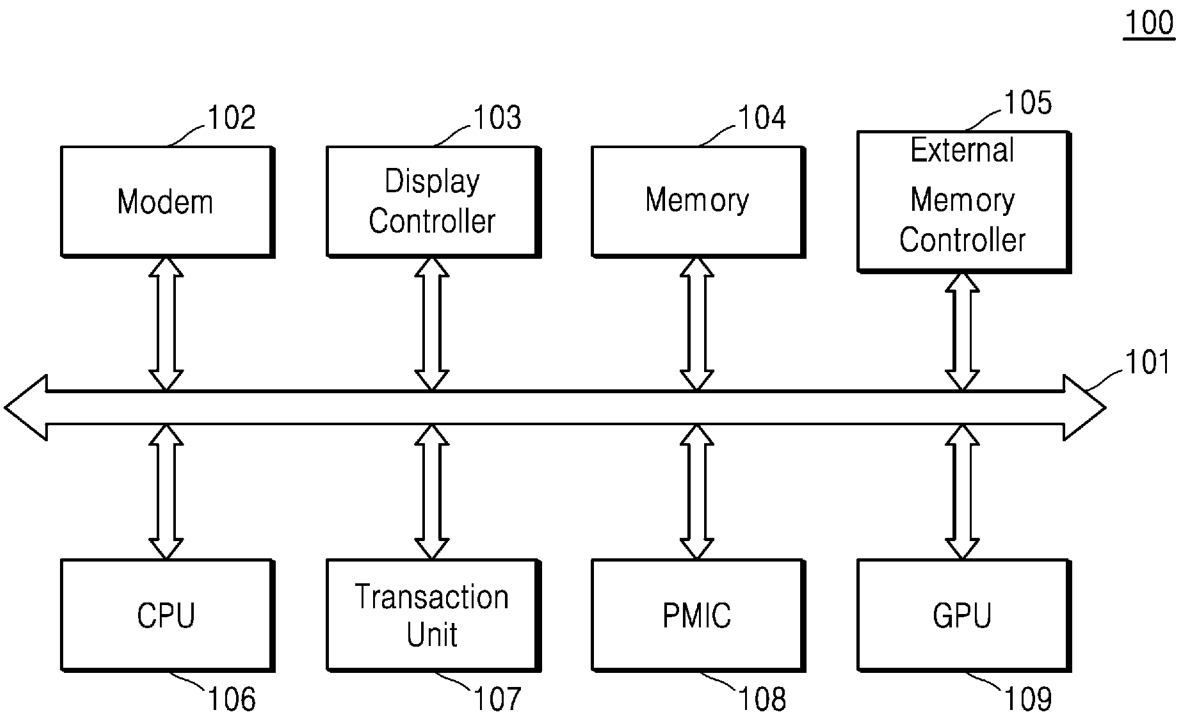
FIG. 10 is a block diagram illustrating a system on chip (SoC) according to an embodiment.

FIG. 10 is a block diagram illustrating a system on chip (SoC) 100 according to an embodiment. The SoC 100 may a semiconductor device, and may include an integrated circuit according to an embodiment. The SoC 100 may be a single chip in which complex blocks, such as for performing various functions, are implemented. In addition, the SoC 100 may be designed by a method of designing an integrated circuit according to embodiments, and accordingly, the SoC 100 may have high performance and efficiency. Referring to FIG. 10, the SoC 100 may include a modem 102, a display controller 103, a memory 104, an external memory controller 105, a central processing unit (CPU) 106, a transaction unit 107, a power management integrated circuit (PMIC) 108, and a graphics processing unit (GPU) 109, and the functional blocks of the SoC 100 may communicate with one another via a system bus 101.

The CPU 106 capable of controlling an operation of the SoC 100 at a top layer may control operations of other functional blocks (102 to 109). The modem 102 may demodulate a signal received from the outside of (e.g., from a device external to) the SoC 100, or may modulate a signal generated inside the SoC 100 and transmit the modulated signal to the outside. The external memory controller 105 may control an operation of transmitting and receiving data from an external memory device connected to the SoC 100. For example, a program and/or data stored in the external memory device may be provided to the CPU 106 or the GPU 109 under control by the external memory controller 105. The GPU 109 may execute program instructions related to graphics processing. The GPU 109 may receive graphics data via the external memory controller 105, and may transmit the graphics data processed by the GPU 109 to the outside of the SoC 100 via the external memory controller 105. The transaction unit 107 may monitor data transactions of the respective functional blocks, and the PMIC 108 may control power supplied to the respective functional blocks under control by the transaction unit 107. The display controller 103 may transmit data generated inside the SoC 100 to a display by controlling the display (or a display device) outside the SoC 100. The memory 104 may include a non-volatile memory, such as electrically erasable programmable read-only memory (EEPROM) or flash memory, or may include a volatile memory, such as dynamic random access memory (DRAM) or static random access memory (SRAM).

Figure 11:
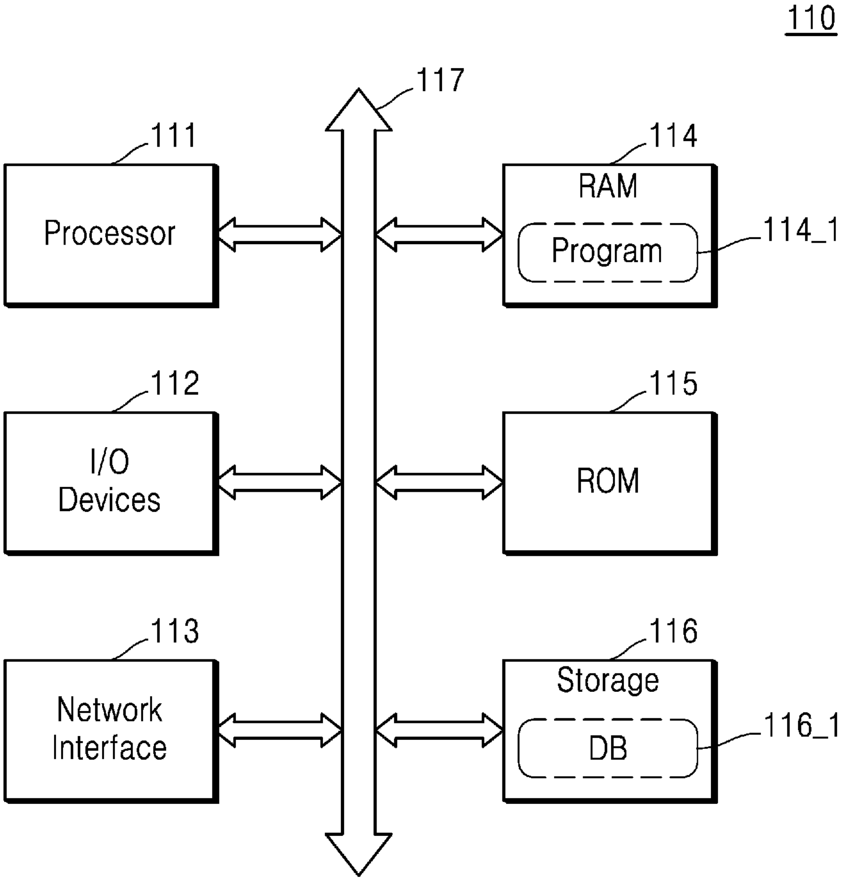
FIG. 11 is a block diagram illustrating a computing system including a memory for storing a program, according to an embodiment.

FIG. 11 is a block diagram illustrating a computing system 110 including a memory for storing a program, according to an embodiment. A method of designing an integrated circuit, according to embodiments, for example, at least some of the operations of the flowchart described above, may be performed by the computing system (or a computer) 110.

The computing system 110 may be a stationary computing system, such as a desktop computer, a workstation, or a server, or may be a portable computing system, such as a laptop computer. As illustrated in FIG. 11, the computing system 110 may include a processor 111, input/output devices 112, a network interface 113, random access memory (RAM) 114, read only memory (ROM) 115, and a storage device 116. The processor 111, the input/output (I/O) devices 112, the network interface 113, the RAM 114, the ROM 115, and the storage device 116 may be connected to a bus 117, and may communicate with one other via the bus 117.

The processor 111 may be referred to as a processing unit, and may include, for example, at least one core capable of executing a random instruction set (e.g., Intel Architecture-32 (IA-32), 64-bit expansion IA-32, x86-64, Power PC, Sparc, MIPS, ARM, IA-64, and the like), like a microprocessor, an application processor (AP), a digital signal processor (DSP), or a GPU. For example, the processor 111 may access a memory, i.e., the RAM 114 or the ROM 115, via the bus 117, and may execute instructions stored in the RAM 114 or the ROM 115.

The RAM 114 may store a program 114_1 for a method of designing an integrated circuit according to an embodiment, or at least a portion thereof, and the program 114_1 may enable the processor 111 to perform a method of designing an integrated circuit, e.g., at least some of the operations included in the methods of FIG. 8. In other words, the program 114_1 may include a plurality of instructions executable by the processor 111, and the plurality of instructions included in the program 114_1 may enable the processor 111 to perform, for example, at least some of the operations included in the flowcharts described above.

The storage device 116 may not lose stored data even when power supplied to the computing system 110 is cut off. For example, the storage device 116 may include a non-volatile memory device, and may include a storage medium, such as magnetic tape, an optical disk, or a magnetic disk. In addition, the storage device 116 may be detachable from the computing system 110. The storage device 116 may also store the program 114_1 according to an embodiment, and the program 114_1 or at least a portion thereof may be loaded from the storage device 116 into the RAM 114 before the program 114_1 is executed by the processor 111. Alternatively, the storage device 116 may store a file written in a program language, and the program 114_1 generated by a compiler or the like or at least a portion thereof may be loaded from the file into the RAM 114. Also, as illustrated in FIG. 11, the storage device 116 may store a database 116_1, and the database 116_1 may include information that may be used for designing an integrated circuit, e.g., information regarding designed blocks, the cell library D12 and/or the design rule D14 of FIG. 8.

The storage device 116 may also store data to be processed by the processor 111 or data processed by the processor 111. In other words, the processor 111 may generate data by processing the data stored in the storage device 116 according to the program 114_1, and may store the generated data in the storage device 116. For example, the storage device 116 may store the RTL data D11, the netlist data D13, and/or the layout data D15 of FIG. 8.

The input/output devices 112 may include an input device, such as a keyboard or a pointing device, and may include an output device, such as a display device or a printer. For example, via the input and output devices 112, a user may trigger execution of the program 114_1 by the processor 111, may input the RTL data D11 and/or the netlist data D13 in FIG. 8, and identify the layout data D15 of FIG. 8.

The network interface 113 may provide access to a network outside the computing system 110. For example, the network may include a plurality of computing systems and communication links, and the communication links may include wired links, optical links, wireless links, or any other types of links.

As described above, embodiments have been disclosed in the drawings and description. Although the embodiments have been described by using specific terms herein, the terms are used only for describing examples of the inventive concepts and are not used to limit the meaning or limit the scope of the inventive concepts defined by claims. While the inventive concept has been particularly shown and described with reference to embodiments thereof, it will be understood that various changes in form and details may be made therein without departing from the scope of the following claims.

What is claimed is:

1. An integrated circuit comprising:
a first cell in a first row extending in a first direction;
a first power line extending in the first direction in a power rail layer, the first power line being configured to provide a first supply voltage to the first cell; and
a first pattern overlapping a first boundary of the first row and extending in the first direction in a first wiring layer, the first boundary extending in the first direction and the first wiring layer being over the power rail layer;
wherein the first cell includes:
at least one pattern extending in the first direction in the first wiring layer; and
at least one transistor between the power rail layer and the first wiring layer such that the first wiring layer is at least partially over the at least one transistor and the power rail layer is at least partially under the at least one transistor, and
wherein the first pattern is configured to receive a first input signal or a first output signal of the first cell.

2. The integrated circuit of claim 1, further comprising:
a second pattern electrically connected to the first pattern, and extending in a second wiring layer in a second direction that is perpendicular to the first direction.

3. The integrated circuit of claim 1, further comprising:
a second cell in the first row, and including one or more patterns extending in the first direction in the first wiring layer, wherein the first pattern overlaps a boundary of the second cell and is electrically insulated from the second cell.

4. The integrated circuit of claim 1, further comprising:
a second cell in the first row or a second row adjacent to the first row, and including one or more patterns extending in the first direction in the first wiring layer, wherein the first pattern is configured to receive a second input signal or a second output signal of the second cell.

5. The integrated circuit of claim 4, wherein each of the first cell and the second cell is configured to receive a clock signal as the first or second input signal, and the first pattern is configured to receive the clock signal.

6. The integrated circuit of claim 4, wherein the first row has a first height that is different from a second height of the second row.

7. The integrated circuit of claim 1, further comprising: a second pattern overlapping a second boundary of the first row, and extending in the first direction in the first wiring layer.

8. The integrated circuit of claim 1, further comprising: a second power line extending in the first direction in the power rail layer, and configured to provide a second supply voltage to the first cell.

9. The integrated circuit of claim 1, wherein the at least one pattern and the first pattern overlap tracks extending in the first direction and at a uniform pitch in a second direction that is perpendicular to the first direction.

10. The integrated circuit of claim 1, wherein the first pattern has a width that is same as a width of each of the at least one pattern in a second direction that is perpendicular to the first direction.

11. The integrated circuit of claim 1, wherein the first cell comprises:

at least one first via electrically connected to the at least one pattern; and at least one second via electrically connected to the first power line.

12. An integrated circuit comprising:

a first cell in a first row extending in a first direction;

a first power line extending in the first direction in a power rail layer, the first power line being configured to provide a first supply voltage to the first cell; and a first pattern and a second pattern adjacent to each other, each extending in the first direction in a first wiring layer, a first boundary extending in the first direction between the first row and a second row adjacent to the first row being between the first pattern and the second pattern, the first wiring layer being over the power rail layer, wherein the first cell includes:

at least one pattern extending in the first direction in the first wiring layer; and at least one transistor between the power rail layer and the first wiring layer such that the first wiring layer is at least partially over the at least one transistor and the power rail layer is at least partially under the at least one transistor, and wherein the first pattern is configured to receive a first input signal or a first output signal of the first cell.

13. The integrated circuit of claim 12, further comprising: a second cell arranged in the second row, and including one or more patterns extending in the first direction in the first wiring layer, wherein the second pattern is configured to receive a second input signal or a second output signal of the second cell.

14. The integrated circuit of claim 12, further comprising: a third pattern electrically connected to the first pattern, and extending in a second wiring layer in a second direction that is perpendicular to the first direction.

15. The integrated circuit of claim 12, further comprising: a second cell in the first row, and including one or more patterns extending in the first direction in the first wiring layer, wherein the first pattern overlaps a boundary of the second cell, and is electrically insulated from the second cell.

16. The integrated circuit of claim 12, further comprising: a second cell in the first row or the second row, and including one or more patterns extending in the first direction in the first wiring layer, wherein the first pattern is configured to receive a second input signal or a second output signal of the second cell.

17. The integrated circuit of claim 16, wherein each of the first cell and the second cell is configured to receive a clock signal as the first or second input signal, and the first pattern is configured to receive the clock signal.

18. The integrated circuit of claim 12, wherein the first row has a first height that is different from a second height of the second row.

19. The integrated circuit of claim 12, further comprising: a third pattern adjacent to a second boundary of the first row, and extending in the first direction in the first wiring layer.

20. An integrated circuit comprising:

a plurality of cells in a plurality of rows extending in a first direction;

a plurality of power lines extending in the first direction in a power rail layer, the plurality of power lines being configured to provide a first supply voltage or a second supply voltage to each of the plurality of cells; and a plurality of first patterns overlapping respective boundaries of the plurality of rows or immediately adjacent to the respective boundaries, the plurality of first patterns extending in the first direction in a first wiring layer, the first wiring layer being over the power rail layer, wherein each of the plurality of cells includes:

at least one second pattern extending in the first direction in the first wiring layer; and at least one transistor between the power rail layer and the first wiring layer such that the first wiring layer is at least partially over the at least one transistor and the power rail layer is at least partially under the at least one transistor, and wherein the plurality of first patterns include a first pattern configured to receive a first input signal or a first output signal of a first cell among the plurality of cells in a first row among the plurality of rows.

* * * * *